US012772410B1

(12) United States Patent
Lin et al.

(10) Patent No.: US 12,772,410 B1
(45) Date of Patent: Oct. 20, 2026

(54) SERVER CHASSIS WITH REVERSIBLE AIRFLOW

(71) Applicant: AMD Design, LLC, Wilmington, DE (US)

(72) Inventors: Ting Yu Lin, Secaucus, NJ (US); Haiyan Luo, Secaucus, NJ (US)

(73) Assignee: AMD Design, LLC, Wilmington, DE (US)

( * ) Notice: Subject to any disclaimer, the term of this patent is extended or adjusted under 35 U.S.C. 154(b) by 378 days.

(21) Appl. No.: 18/626,509

(22) Filed: Apr. 4, 2024

(51) Int. Cl.
*H05K 7/20* (2006.01)

(52) U.S. Cl.
CPC ..... *H05K 7/20172* (2013.01); *H05K 7/20145* (2013.01); *H05K 7/20736* (2013.01); *H05K 7/20836* (2013.01)

(58) Field of Classification Search
CPC ........... H05K 7/20172; H05K 7/20145; H05K 7/20736; H05K 7/20836
See application file for complete search history.

(56) References Cited

U.S. PATENT DOCUMENTS

| | | | | |
|---|---|---|---|---|
| 9,936,612 | B2 * | 4/2018 | Goulden | H05K 7/20836 |
| 2012/0069514 | A1 * | 3/2012 | Ross | H05K 7/20718 361/679.33 |
| 2025/0113461 | A1 * | 4/2025 | Tuan | G06F 1/20 |

* cited by examiner

*Primary Examiner* — Gary Collins
(74) *Attorney, Agent, or Firm* — Dergosits & Noah LLP; Todd A. Noah

(57) ABSTRACT

System and method for providing reversible path for air to flow through a server chassis. The chassis having a moveable barrier extending vertically in a first airflow channel between first and second horizontal surfaces when closed, a second air airflow channel between the second and third horizontal surfaces and a moveable barrier extending vertically in a third airflow channel between the third and fourth horizontal surfaces when closed. The chassis also includes a movable barrier in a front-end frame connecting the first and third horizontal surfaces a movable barrier in a rear-end frame connecting the second and fourth horizontal surfaces. The third horizontal surface supports a circuit board having a plurality of electronic devices connected thereto, at least one fan and a controller for controlling a direction of airflow generated by the at least one fan.

20 Claims, 12 Drawing Sheets

SERVER CHASSIS WITH REVERSIBLE AIRFLOW

BACKGROUND

In a typical server chassis, e.g., a chassis holding a large number of drives such as a JBOD, components that are downstream in the cooling airflow have operating temperatures that are usually higher than components upstream in the airflow—due to the heat added to the airflow by those upstream components. When upstream components generate significant heat, it requires operating the system fans at higher power to keep all components within thermal specifications.

The different operating temperatures of the different components depending on chassis location may cause several issues. For example, there is an increased overheating risk for high power components that are downstream in the airflow. In addition, maintaining components at higher operating temperatures for an extended length of time leads to increased annual failure rates (AFR) and mean times between failure (MTBF). Furthermore, overall fan power consumption may be increased because of upstream heat generation, which leads to a corresponding increase in sound pressure levels and associated negative effects on the components, such as a decrease in hard drive performance.

FIG. 1 is an upper right perspective view of a prior art server 10. In FIG. 1, server 10 includes a chassis 20 having sides 22*a* . . . 22*f* (side 22*e* is transparent for clarity and side 22*f* is obscured). Chassis side 22*a* is open to provide an inlet for an airflow 60*a*. Chassis side 22*c* is open or perforated to provide an outlet for an airflow 60*b*. Airflows 60*a*, 60*b* are caused by fans 40*a*, 40*b*, which are controlled by a baseboard controller 34 mounted on a baseboard 30. Electronic devices, exemplified by hard drives 50*a* . . . 50*h*, are connected to baseboard 30 in a first row of drives. Chassis 20 has space for two additional rows of drives, indicated by lead drives 52*a*, 54*a*.

Airflows 60*a*, 60*b* represent a "forward" airflow that draws cool air from a cold aisle 62 and deposits heated air in a hot aisle 64. The forward airflow passes through the three rows of devices, absorbing heat in the process. Thus, devices 50*a*, 52*a*, 54*a* receive unheated air directly from cold aisle 62. In contrast, devices 50*h*, 52*h* (not shown), and 54*h* (not shown) receive air with heat contributions from every other device in server 10.

Thus, what is needed is an apparatus and method for reducing the negative effects on a component of a downstream location in a server chassis.

BRIEF DESCRIPTION OF THE DRAWINGS

The embodiments are illustrated by way of example and not limitation in the accompanying drawings, in which like references indicate similar elements, and in which.

DETAILED DESCRIPTION

In embodiments, an apparatus and system provide for the reversing of the airflow through a server chassis. Thus, components that were originally downstream from other heat-generating devices within the server chassis will be upstream from these same heat-generating devices in the reversed airflow. The reversed airflow provides the cooling benefits of an upstream location to components closest to the hot aisle, and without rearranging the components or the hot and cold aisles. Embodiments allow for the chassis to be switched between the forward and reverse airflows. Thus, the negative effects of a component's location in a server chassis may be mitigated by the reverse airflow. By balancing the time components are upstream in the airflow with the time components are downstream in the airflow, embodiments may result in components having, on average, more similar temperature profiles, which may result in improved overall AFR and MTBF.

Figure 1:
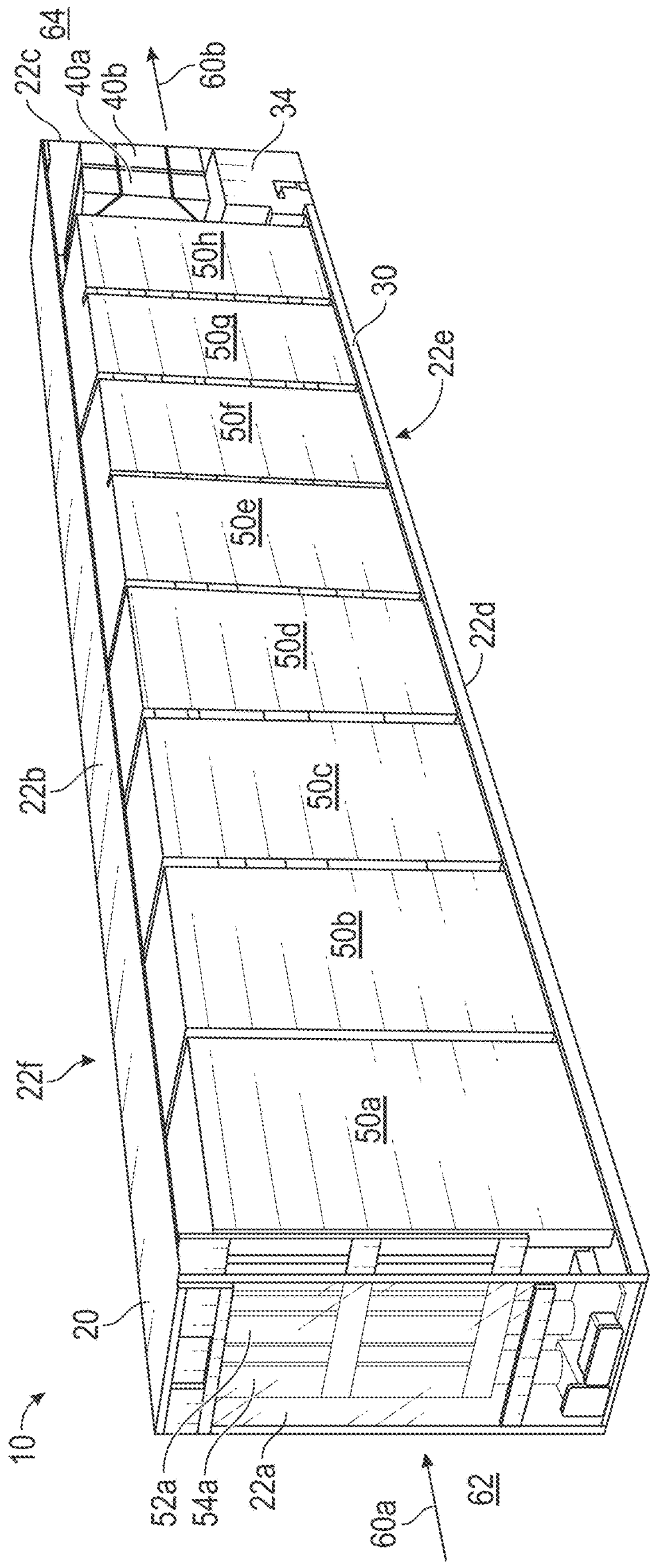
FIG. 1 (Prior Art)
FIG. 1 is an upper right perspective view of a prior art server.
Figure 2:
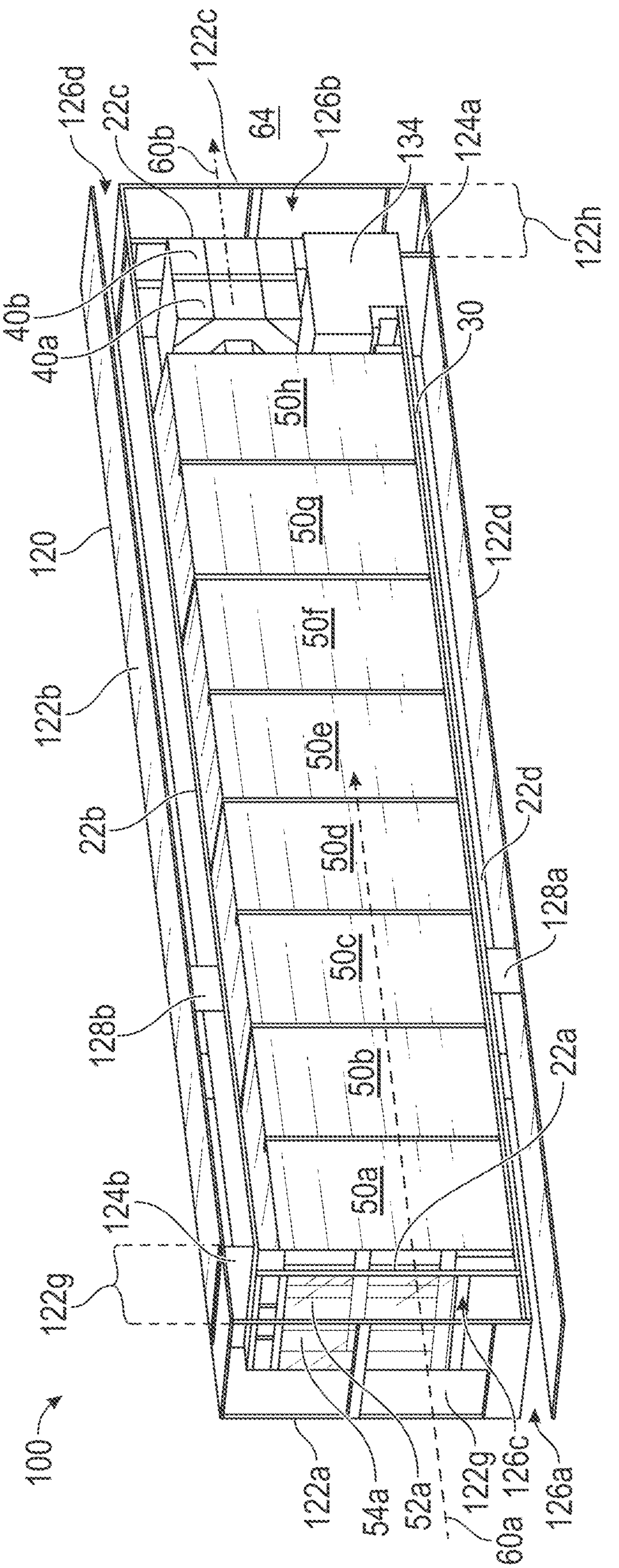
FIG. 2 is an upper right perspective view of an embodiment of a server chassis with a reversible airflow in a first state.
Figure 3:
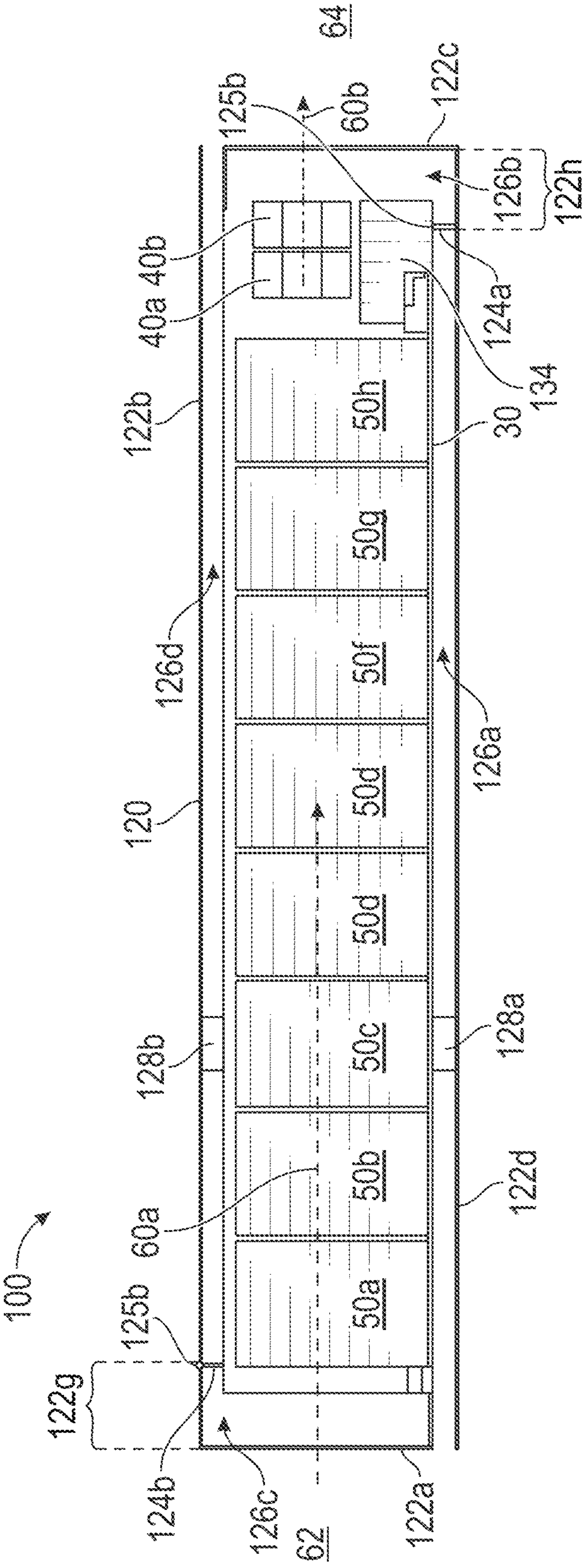
FIG. 3 is right-side view of the embodiment of the server chassis with a reversible airflow of FIG. 2 in the first state.

FIG. 2 is an upper right perspective view of an embodiment of a server chassis with a reversible airflow in a first state. FIG. 3 is a right-side view of the same configuration. In FIG. 2, server 100 includes many of the elements of server 10 of FIG. 1, and those reference numbers are maintained. Server 100 is in a "first state" in the sense that it is configured for the forward flow of airflows 60*a*, 60*b*. Server 100 further includes a reversible-airflow chassis 120 having a front-end frame 122*a*, a top side 122*b*, a rear-end frame 122*c*, a bottom side 122*d*, a left side (not shown), a right side (shown in FIG. 12 as 122*f*). One or more windows may be included in each of the front-end frame 122*a* and the rear-end frame 122*c* through which airflows 60*a*, 60*b* travel.

Figure 12:
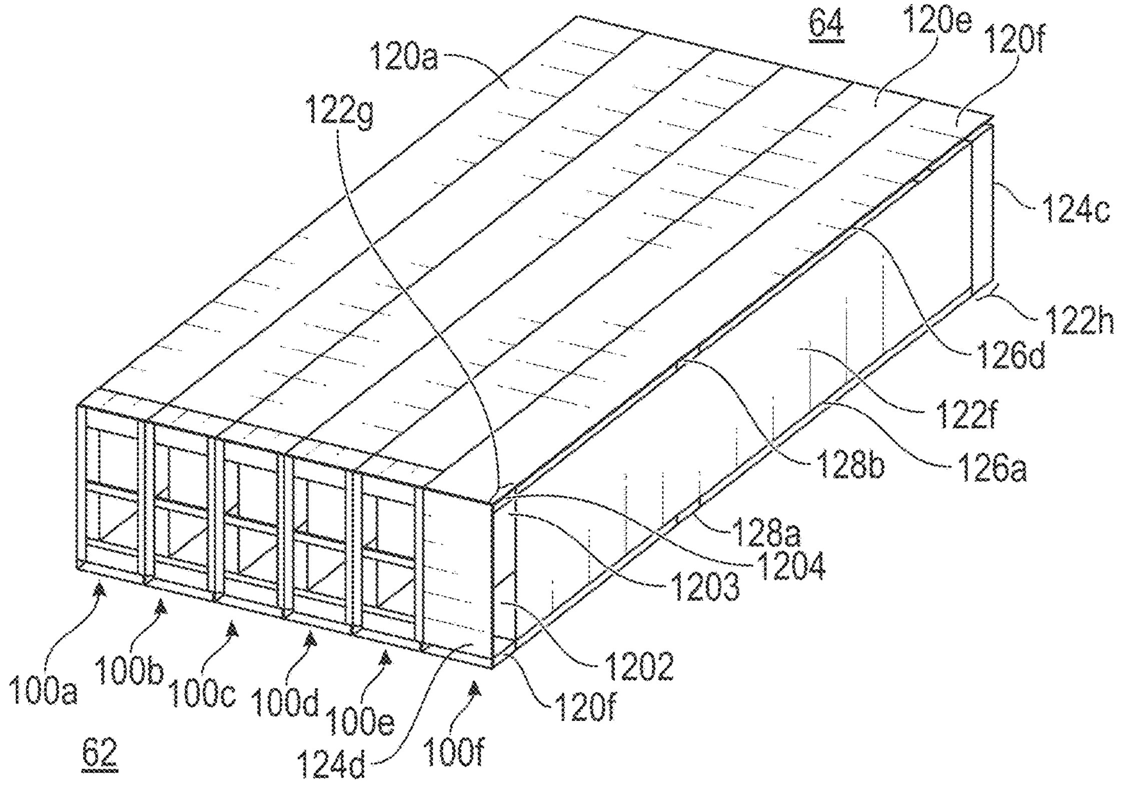
FIG. 12 is an upper right perspective view of a plurality of an embodiment of a server chassis with a reversible air flow.

Top side 122*b* is connected to front-end frame 122*a* and separated from top 22*b* by a spacer 128*b* on both sides of top side 122*b*. Similarly, bottom side 122*d* is connected to rear-end frame 122*c* and separated from bottom 22*d* by a spacer 128*a* on both sides of bottom side 122*d*. Since spacers 128*a* are positioned on the sides of bottom side 122*d*, they do not block the airflow through channel 126*a*. Since spacers 128*b* are positioned on the sides of top side 122*b*, they do not block the airflow through channel 126*d*. Reversible-airflow chassis 120 includes a rear cap section 122*h* and a front cap section 122*g*. Chassis 120 includes a rear cap section 122*h* and a front cap section 122*g*. Front cap section 122*g* includes a movable barrier 124*b* and front-end frame 122*a*. Front cap section 122*g* also includes solid panels on the sides of front cap section 122*g* that lie on top side 122*b*, left side 122*e*, and right side 122*f*. The solid panels are not shown for clarity of the underlying elements; however, FIG. 12 shows front cap section 122*g* enclosed. Front cap section 122*g* includes a bottom panel that extends from bottom side 22*d*. Front cap section 122*g* includes a bottom panel that extends from bottom side 22*d*. Thus, front cap section 122*g* creates a short duct extending from the front of chassis side 22*a* and rises above chassis side 22*b*. With front-end frame window 122*a* open as shown, airflow 60*a* may be drawn through chassis side 22*a*. Similarly, rear cap section 122*h* includes a movable barrier 124*a*, a flap in this embodiment, and rear-end frame 122*c*. Rear cap section 122*h* also includes solid panels on the sides of rear cap section 122*h* that lie on left side 122*e*, right side 122*f*, and bottom side 122*d*. The solid panels are not shown for clarity of the underlying elements; however, FIG. 12 shows front cap section 122*h* enclosed. Rear cap section 122*h* includes a top panel that extends from top side 22*b*. Rear cap section 122*h* includes a top panel that extends from top side 22*b*. Thus, rear cap section 122*h* creates a short duct extending from the rear of chassis side 22*c* and drops below chassis side 22*d*. Chassis 120 creates passageways 126*a* . . . 126*d* about the perimeter of chassis 10, which will be discussed further with regard to FIG. 4 and FIG. 5.

FIG. 3 further illustrates that bottom passageway 126*a* leads from cold aisle 62 to rear cap section 122*h* and that top passageway 126*d* leads from front cap section 122*g* to hot aisle 64. In a different embodiment, front cap section 122*g* and passageway 126*d* could be flipped so that passageway 126*d* lies below server side 22*d*. In such an embodiment, rear cap section 122*h* and passageway 126*a* would be flipped so that passageway 126*a* lies above server side 22*b*.

In the normal forward flow configuration as shown in FIG. 2 and FIG. 3, barriers 124*a*, 124*b* are closed. Thus, passageways 126*a*, 126*d* are also closed. FIG. 2 indicates airflows 60*a*, 60*b*, however a fan controller 134 has the ability to control fans 40*a*, 40*b* so that airflow may be reversed and caused to flow first through drive 50*h* and then on to drives 50*g* . . . 50*a*. With server 100 in the first state shown in FIG. 2 and FIG. 3, such a reversed fan flow would draw heat from hot aisle 64 through frame 122*c* and into server chassis 120, which is undesirable.

Figure 4:
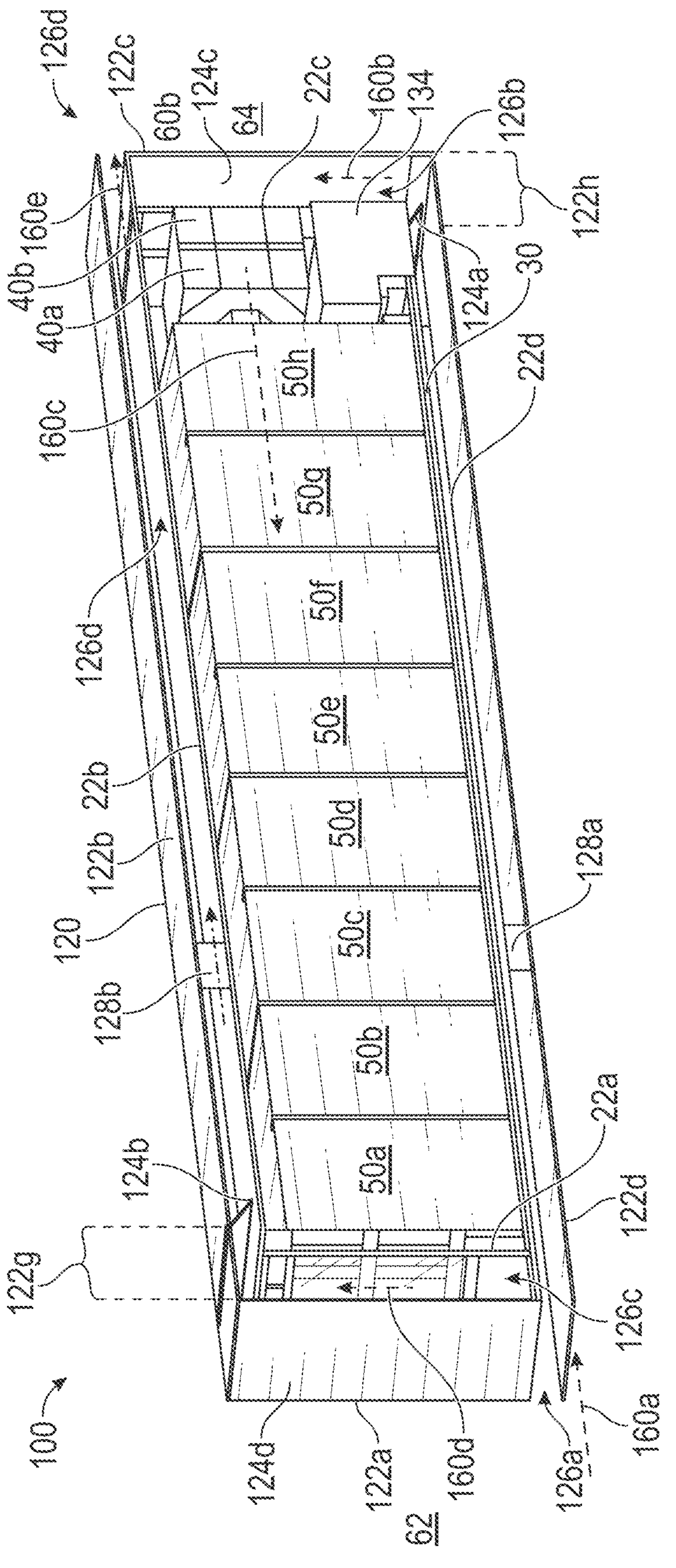
FIG. 4 is an upper right perspective view of the embodiment of the server chassis with a reversible airflow of FIG. 2 in a second state.
Figure 5:
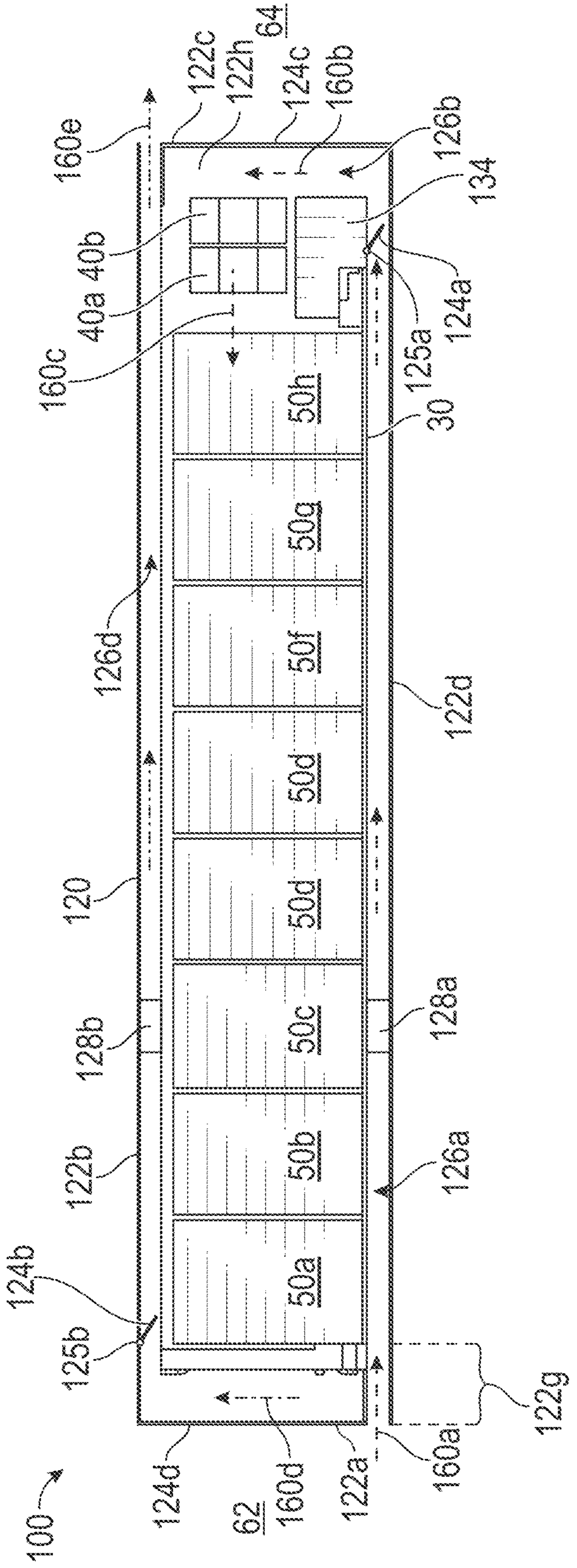
FIG. 5 is a right-side view of the embodiment of the server chassis with a reversible airflow of FIG. 2 in the second state.

FIG. 4 is an upper right perspective view of the embodiment of the server chassis with a reversible airflow of FIG. 2 in a second state. FIG. 5 is a right-side view of the same configuration. Server 100 is in a "second state" in the sense that it is configured for a reverse flow indicated by airflows 160*a* . . . 160*e*. In FIG. 4, controller 134 has directed fans 40*a*, 40*b* to reverse the airflow. Furthermore, a movable barrier 124*c* is shown in place in rear-end frame 122*c*, and a movable barrier 124*d* is shown in place in front-end frame 122*a*. With the addition of barriers 124*c*, 124*d*, front cap section 122*g* and rear cap section 122*h* each have a single inlet and outlet. In rear cap section 122*h*, the inlet is past movable barrier 124*a* and the outlet is through chassis side 22*c* and fans 40*a*, 40*b*. In front cap section 122*g*, the inlet is through chassis side 22*a* and the outlet is past movable barrier 124*b*. Consequentially, when fans 40*a*, 40*b* reverse direction, they draw airflows 160*a*, 160*b* in from cold aisle 62 through passageway 126*a* and into passageway 126*b* of rear cap section 122*h*. Fans 40*a*, 40*b* then force airflow 160*c* through the drives in the reverse order: bathing drive 50*h* and its column-mates in unheated air directly from cold aisle 62 first. Airflow 160*c* then proceeds through drives 50*h* . . . 50*a*. Thus, server 100 provides an apparatus and system that reverses the airflow through drives 50*a* . . . 50*h*, making drive 50*h* the upstream drive in the reverse airflow. After drive 50*a*, airflow 160*c* exits through chassis side 22*a* into passageway 126*c* of forward cap section 122*g* and out through passageway 126*d* into hot aisle 64.

In the embodiment of FIG. 4 and FIG. 5, barrier 124*a* is flap dislodged by a pressure differential between passageways 126*a* and 126*b* and pivoting about an upper hinge 125*a* to the open position shown. Similarly, barrier 124*b* is a flap dislodged by a pressure differential between passageways 126*c* and 126*d* and pivoting about an upper hinge 125*b* to the open position shown. In the embodiment, movable barriers 124*c*, 124*d* are shown as panels installed on front-end frame 122*a* and rear-end frame 122*c*. However, in other embodiments, barriers 124*c*, 124*d* may incorporate flaps like those of barriers 124*a*, 124*b*, and as discussed with regard to FIG. 15-FIG. 17. In such an embodiment, barrier 124*c* would be attached to the rear of window 122*c* and be hinged so that airflow 60*b* would push barrier 124*c* open—outward into hot aisle 64 (see, e.g., FIG. 15 and open flap 1500*c*). Reverse airflow 160*c* would cause such a flap to be drawn closed—inward from hot aisle 64 (see, e.g., FIG. 15 and closed flaps 1500*a*, 1500*b*). Similarly, barrier 124*d* would be attached to the inner side of front-end frame 122*a* and be hinged so that airflow 60*a* would draw barrier 124*d* open—inward into front cap section 122*g*. Reverse airflow 160*c* would create pressure in front cap section 122*g* that causes such a flap to remain closed against front-end frame 122*a*. Such an embodiment, in which each of barriers 124*a* . . . 124*d* is a pivotable flap, provides for reversing the airflow just by using controller 134 to reverse the direction of the airflow produced by fans 40*a*, 40*b*. In another embodiment, each of barriers 124*a* . . . 124*d* may be removed or installed manually. In the reverse flow of FIG. 4 and FIG. 5, movable barriers 124*c*, 124*d* are closed and movable barriers 124*a*, 125*b* are open to create a serpentine flow path leading from the cold aisle to the rearmost device. Then fans 40*a*, 40*b* are controlled to create a reversed airflow. In this manner, embodiments reverse the airflow through drives 50*a* . . . 50 h and ameliorate the negative effects associated with a particular device always being in the same position with respect to other heat producing devices in airflow 60*a*.

In an embodiment, a kit includes a front cap section (e.g., 122*g*) including movable barriers (e.g., barriers 124*b*, 124*d*), a top plate and spacers, a rear cap section (e.g., 122*h*) including movable barriers (e.g., barriers 124*a*, 124*c*), and a bottom plate and spacers. This kit may be assembled onto a server (e.g., server 10) with a controller 134 configurable to reverse the airflow to provide a server (e.g., server 100) with a reversible airflow.

Figure 6:
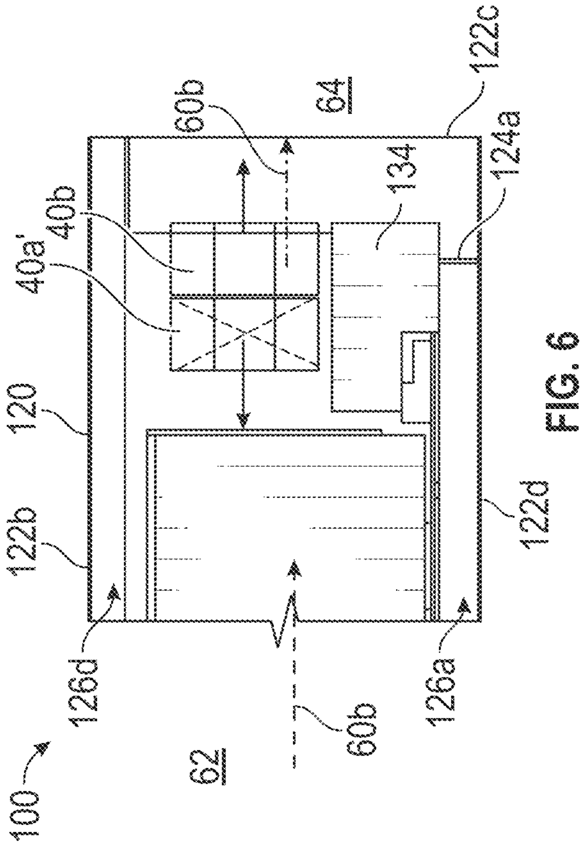
FIG. 6 is right-side view of an embodiment of a server chassis with a reversible airflow in the first state.
Figure 7:
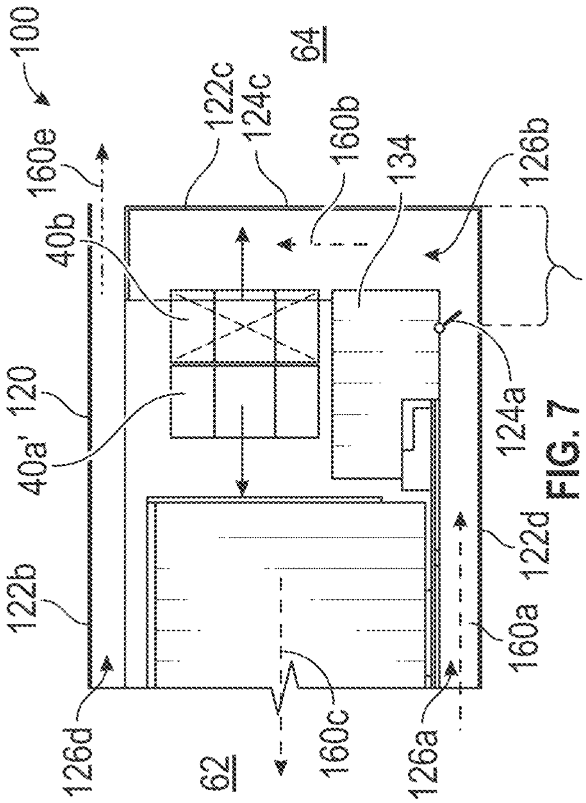
FIG. 7 is right-side view of the embodiment of the server chassis with a reversible airflow of FIG. 6 in the second state.

FIG. 6 is right-side view of server 100 in the first state. FIG. 6-FIG. 9 illustrate different methods of using fans 40*a*,

40*b* and using controller 134 to control fans 40*a*, 40*b*. In FIG. 6-FIG. 9, fans 40*a*' represents fan 40*a* from previous figures, but reversed so that the "normal" direction of flow now points in the opposite direction of flow 60*b*. In other words, fans 40*a*, 40*b* are now placed back-to-back and the "backward" fan 40*a* has been redesignated as fan 40*a*'. In these figures, a dotted "X" through a fan indicates that the fan is unpowered. In FIG. 6 and FIG. 7, fans 40*a*', 40*b* are limited to each providing flow in only one direction. Fan 40*b* provides forward airflow and fan 40*a*' provides reverse airflow. For normal forward flow, fan 40*b* is powered and fan 40*a*' is unpowered. For example, forward flow 60*b* may be caused by controller 134 using solely fan 40*b* in the normal forward flow mode while leaving fan 40*a*' unpowered. FIG. 7 shows server 100 in the reverse state. FIG. 7 illustrates that reverse flow 160*c* may be caused by controller 134 employing solely fan 40*a*' in the normal flow mode while leaving fan 40*b* unpowered.

Figure 8:
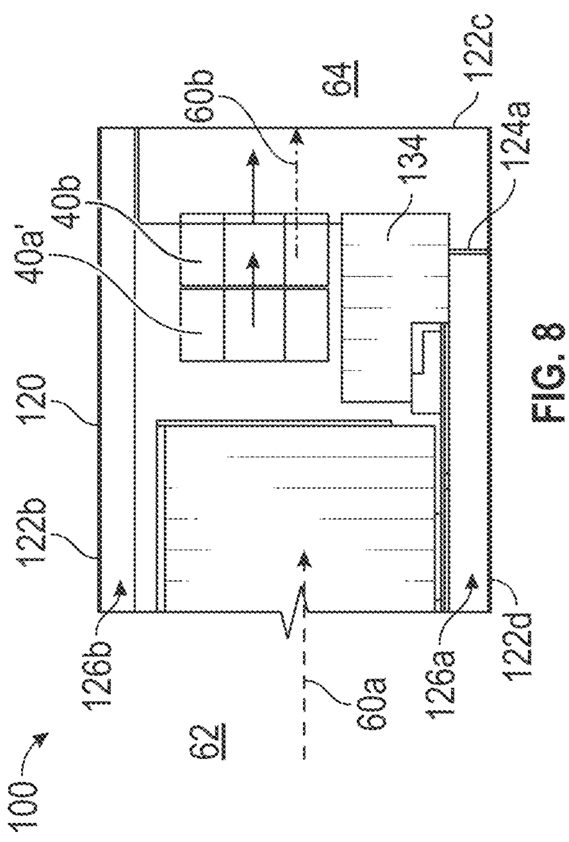
FIG. 8 is right-side view of an embodiment of a server chassis with a reversible airflow in the first state.
Figure 9:
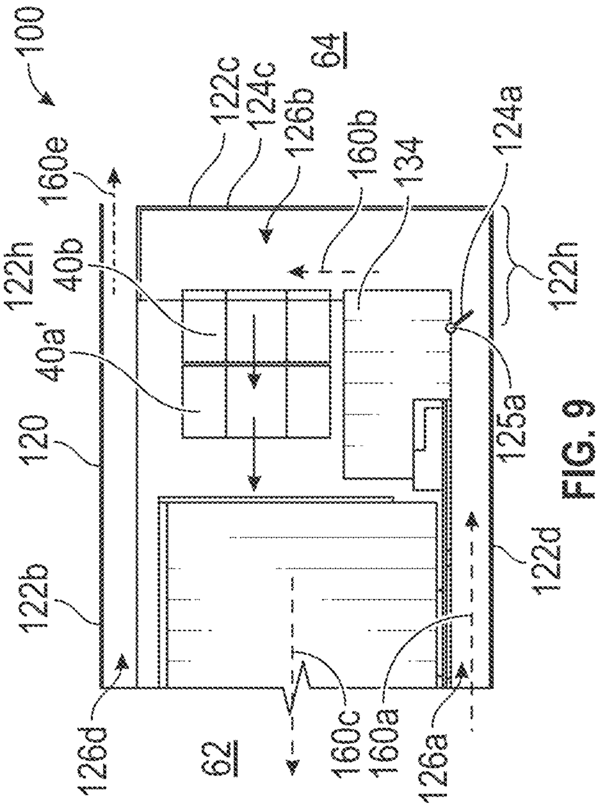
FIG. 9 is right-side view of the embodiment of the server chassis with a reversible airflow of FIG. 8 in the second state.

In FIG. 8 and FIG. 9 fans 40*a*', 40*b* may both run forward and backward and provide forward and reverse airflow. This provides improved flow over the configuration of FIG. 6 and FIG. 7. FIG. 8 shows server 100 in the forward state. FIG. 8 illustrates that forward flow 60*b* may be caused by controller 134 controlling fan 40*a*' to rotate in a reverse flow mode and controlling fan 40*b* to rotate in the normal forward flow mode. FIG. 9 shows server 100 in the reverse state. FIG. 9 illustrates that reverse flow 160*c* may be caused by controller 134 controlling fan 40*a*' to rotate in the normal flow mode and controlling fan 40*b* to rotate in the reverse flow mode. Such different modes of control provide controller 134 with a wide range of fan power using either or both of fans 40*a*', 40*b*.

Regarding fan orientations, the configuration and use of fans 40*a*, 40*b* as described with regard to FIG. 2-FIG. 5 may provide the most airflow in the forward direction, but perhaps relatively less airflow in the reverse direction due to fans 40*a*, 40*b* being configured to be more efficient in the forward direction. The fan configuration and use as described with regard to FIG. 6 and FIG. 7 may provide the least forward and reverse airflow. And the fan configuration and use as described with regard to FIG. 8 and FIG. 9 more provide more forward and reverse airflow than if used as in FIG. 6 and FIG. 7, and may be preferable for providing more reverse airflow than if configured and used as in FIG. 2-FIG. 5.

Figure 10:
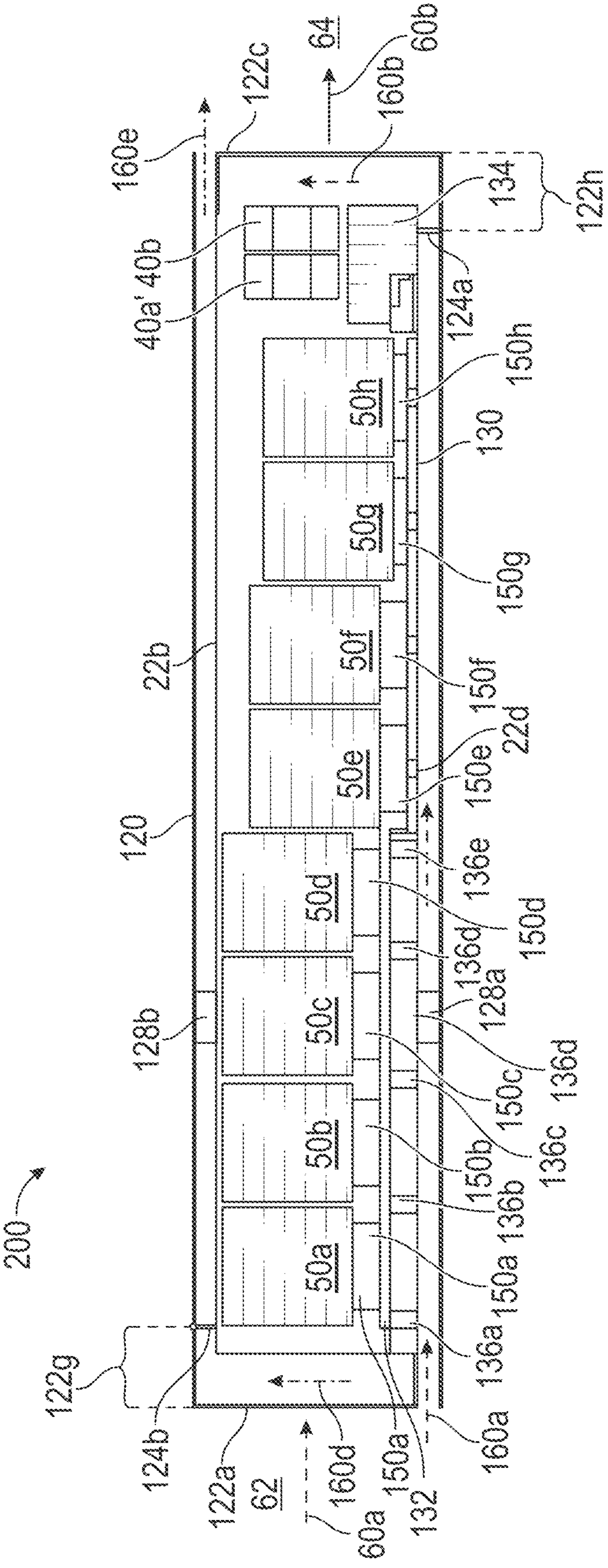
FIG. 10 is a right-side view of an embodiment of a server chassis with a reversible airflow in the first state.

FIG. 10 is a right-side view of an embodiment of a server chassis with a reversible airflow in the first state, i.e., barriers 124*a*, 124*b* are in place, preventing airflow 160*a* . . . 160*e*. FIG. 10 illustrates staggering the heights of drives 50*a* . . . 50*h* to provide improved airflow. In FIG. 10, baseboard 30 has been replaced with a first baseboard 130 connected to a second baseboard 132. Drives 50*g*, 50*h* are connected to baseboard 130 with short connectors 150*g*, 150*h*. Drives 50*e*, 50*f* are connected to baseboard 130 with tall connectors 150*e*, 150*f*. Drives 50*a* . . . 50*d* are connected to baseboard 132 with tall connectors 150*a* . . . 150*d*. In addition, baseboard 132 is elevated in comparison to baseboard 130 by spacers 136*a* . . . 136*e*. As a result, an increased flow path is provided by the increased space between drives 50*a* . . . 50*f* and the open space between baseboard 132 and chassis side 22*d*. Thus, in the first state, forward airflow 60*a* provides cooler air to downstream devices, e.g., devices 50*g*, 50*h*. Similarly, in the second state, an increased initial flow path is created by the space between the tops of drives 50*h* . . . 50*e* and upper chassis side 22*b*. As a result, reverse airflow 160*c* provides cooler air to downstream devices, e.g., 50*d* . . . 50*a*. By using such a staggered arrangement, embodiments may reduce the temperature differential in air received by upstream and downstream devices. This may provide additional improvements to AFR and MTBF.

Figure 11:
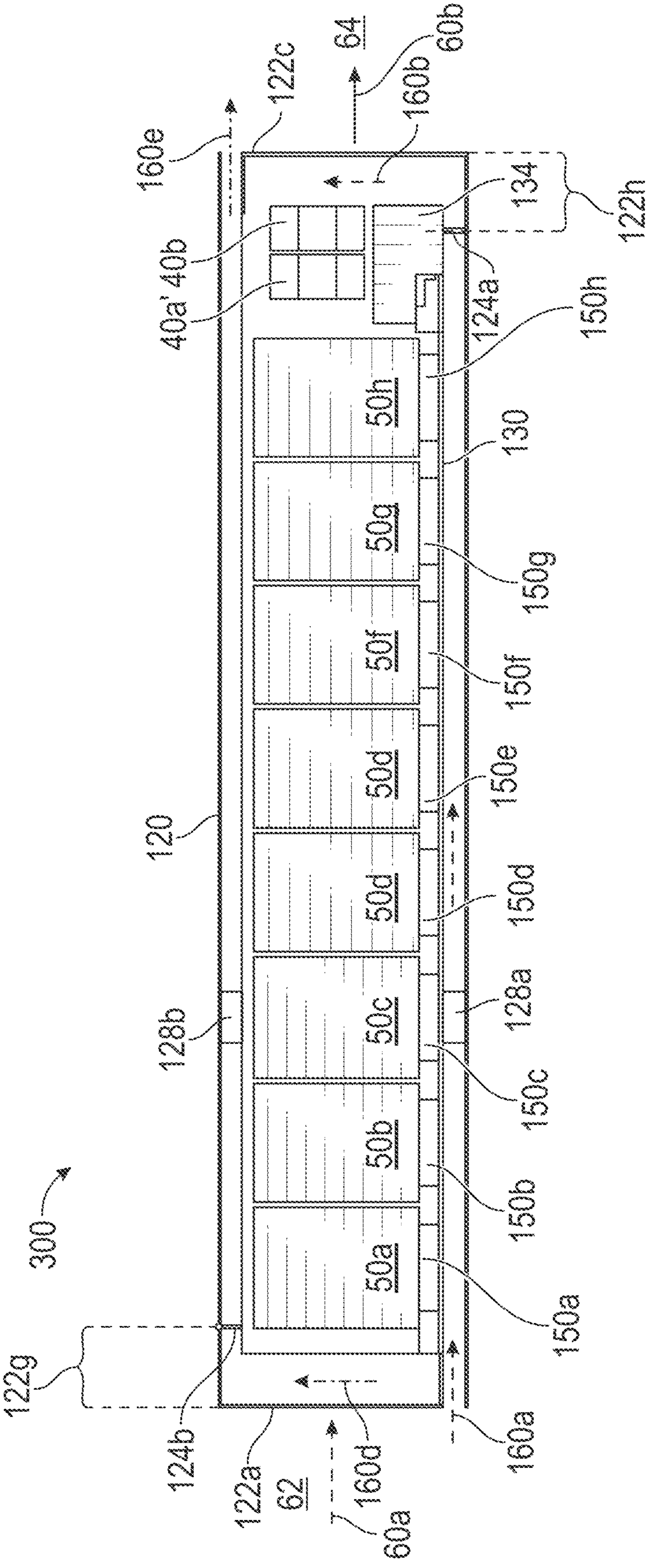
FIG. 11 is a right-side view of an embodiment of a server chassis with a reversible airflow in the first state.

FIG. 11 is a right-side view of an embodiment of a server chassis with a reversible airflow in the first state, i.e., barriers 124*a*, 124*b* are in place, preventing airflow 160*a* . . . 160*e*. In FIG. 11, all drives 50*a* . . . 50*h* are connected to baseboard 130 with connectors 150*a* . . . 150*d* having the same height.

In a test, a first system with the fan configuration of FIGS. 6-7 and the dual-baseboard configuration of FIG. 10 in a reversible server 100 resulted in the HDD in the third row (two rows behind HDD 50*h*) operating at 3° C. lower than a second system with that same HDD with the fan configuration of FIGS. 2-5 and the dual-board configuration of FIG. 10 in a non-reversible chassis, with both systems using 50*w* of fan power. The HDD operated at the same temperature with the first system using 64% of the fan power of the second system.

In a test, a first system with the fan configuration of FIGS. 6-7 and the single baseboard configuration of FIG. 11 in a reversible server 100 resulted in an HDD operating at 4° C. lower than a second system with that same HDD with the fan configuration of FIGS. 2-5 and the dual-board configuration of FIG. 10 in a non-reversible chassis, with both systems using 50*w* of fan power. The HDD operated at the same temperature with the first system using 50% of the fan power of the second system.

In a test, a first system with the fan configuration of FIGS. 8-9 and the single baseboard configuration of FIG. 11 in a reversible server 100 resulted in an HDD experiencing a noise lever 3 dB lower than a second system with that same HDD with the fan configuration of FIGS. 2-5 and the dual-board configuration of FIG. 10 in a non-reversible chassis, with the first system using less fan power than the second system and with the HDD at the same temperature in both cases.

FIG. 12 is an upper right perspective view of a plurality servers 100 in a mixed configuration. In FIG. 12 each server 100*a* . . . 100*f* is an instance of server 100 described earlier. Servers 100*a* . . . 100*e* are in the first state with front-end frame 122*a* open and moveable barriers 124*d* rendered transparent, and otherwise configured for a forward airflow. Server 100*f* is in the second state with barrier 124*d* in place and otherwise configured for a reverse airflow. FIG. 12 illustrates that top passages 126*d* (to the rear of front cap section 122*g*) and bottom passages 126*a* (forward of rear cap section 122*h*) are open to the sides of servers 100 except for spacers 128*a*, 128*b*. As a result, airflow may mingle between adjacent passages 126*a* and between adjacent passages 126*d*. FIG. 12 also illustrates that front cap section 122*g* and rear cap section 122*h* are enclosed, except for the moveable barriers and the passages through which airflow is provided from the front or reach cap section to the electronic devices (i.e., through fans 40*a*, 40*b* (FIG. 4) and through front chassis side 22*a* (FIG. 4)). The enclosure of front cap section 122*g* and rear cap section 122*h* is illustrated with regard to server 100*f*, but applies to each of servers 100*a* . . . 100*e*, equally. The cover of a front or rear side face may include individual cover sections 1202, 1203, and 1204. Although the left side is obscured, each side of front cap section 122*g* should be understood to include such covering plates. Rear cap section 122*h* illustrates that the cover of a front or rear cap side face may be a single cover extending from the bottom of the cap section, e.g., bottom side 122*d*, to the top of the cap section, e.g., even with chassis top side 22*b*. FIG. 12 shows additional side plates 120*f* that connect each side of front cap section 122*g* to bottom side 122*d*. In the embodiment, upper passageway 126_d_ and lower passageway 126_a_ are shown to be open to the right side of server 100_f_. It may seem that this would allow air from hot aisle 64 to be drawn into the lower passageway near rear cap section 122_h_ and allow heated air from front cap section 122_g_ to be dispersed into cold aisle 62. However, in a typical use of such servers, the entire unit would be installed in a server rack with the right side of server 100_f_ and the left side of server 100_a_ being effectively sealed by being installed in the rack. Thus, in the embodiment, the rack is relied upon to prevent heated airflow from server 100_f_ from escaping into the cold aisle and to prevent air from the hot aisle from being drawn into server 100_f_. In an embodiment, if a server side is not effectively sealed by a rack or abutting another server, the unsealed side of upper passageway 126_d_ and lower passageway 126_a_ may be covered, e.g., by a cover over the entire unsealed side, e.g., by a cover over all of side 122_f_.

Figure 13:
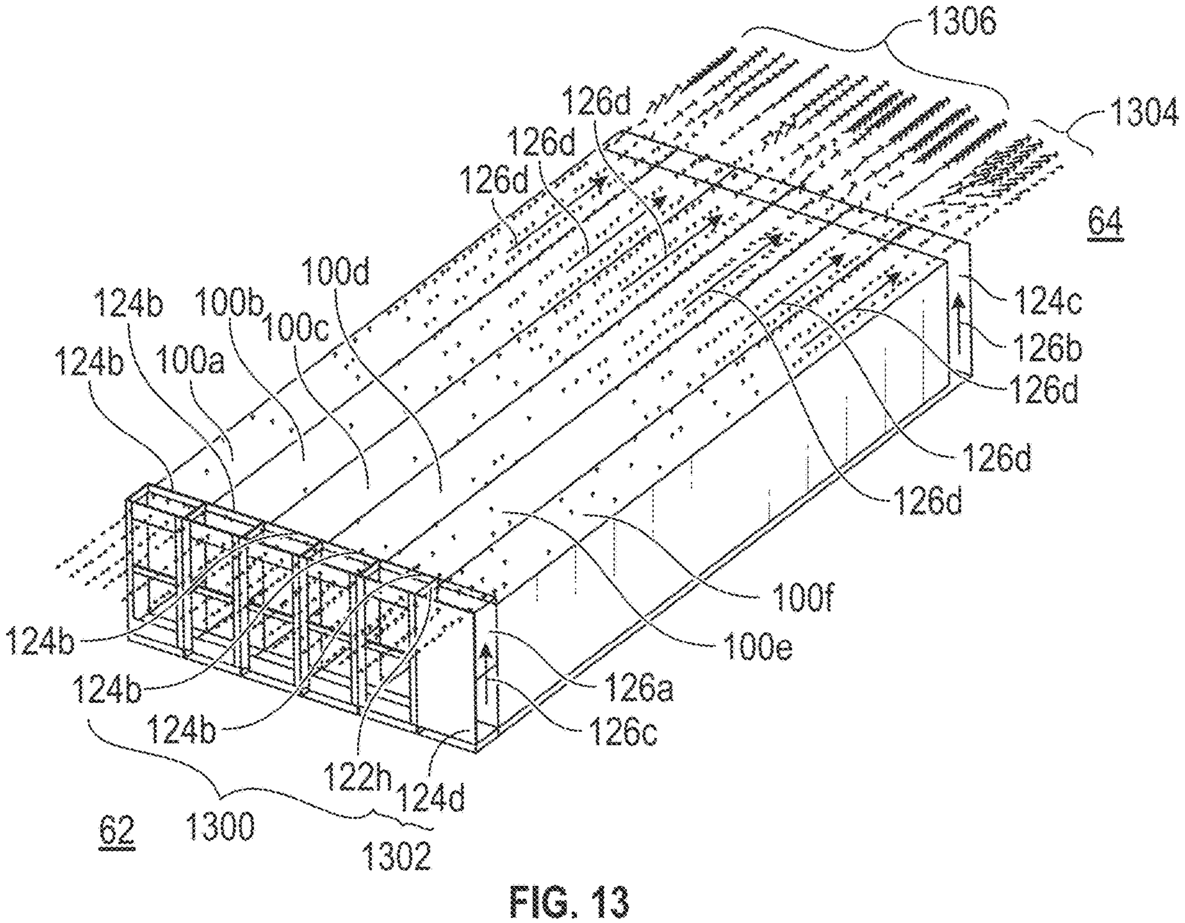
FIG. 13 is a graphical representation of partial airflow through the plurality of server chassis of FIG. 12.

FIG. 13 is a graphical representation of partial airflow through the plurality of server chassis of FIG. 12. In FIG. 13, tops 122_b_ and side spacers 128_b_ are not shown to improve clarity. A server group 1300 includes servers 100_a_ . . . 100_e_ configured for forward airflow and a server group 1302 includes servers (only one representative server 100_f_ is shown) configured for reverse airflow. A collected airflow 1304 and 1306 are both from passages 126_d_ of server group 1302. FIG. 13 illustrates that heated airflow in passages 126_d_ from servers of server group 1302 may be distributed among passages 126_d_ of servers of server group 1300. This distribution may reduce the impedance in the flow path of the servers of group 1302 without impacting the flow of servers of group 1300. The distribution may occur as follows. Airflow leaving passages 126_c_ of servers of server group 1302, represented by server 100_f_, and entering passageways 126_d_ of server group 1302 may immediately spread sideways into any passageway 126_d_ of server group 1300. Since servers of group 1300 do not contribute airflow to passages 126_d_ because barriers 124_b_ are closed in the first state, airflow into passages 126_d_ of server group 1302 may flow into any passageway 126_d_. As shown in FIG. 13, this means that airflow exiting passageway 126_c_ of server 100_f_ may be distributed among six different passageways 126_d_. In other words, the heated airflow from server group 1302 may be distributed among the combined passageways 126_d_ of server groups 1302 and 1300. This reduces the impedance of airflow exiting passageways 126_d_ of servers of server group 1302. Additionally, the forward airflow of server group 1300 is unaffected since barriers 124_b_ of server group 1300 prevent heated airflow in passageways 126_d_ from being drawn into servers of server group 1300.

Figure 14:
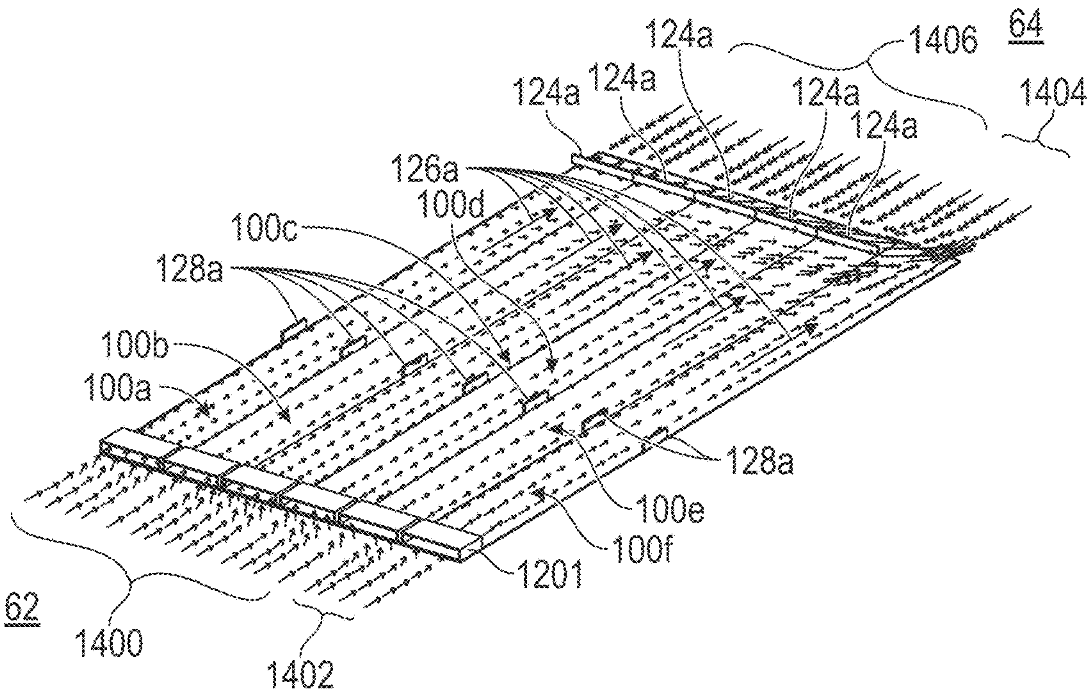
FIG. 14 is a graphical representation of partial airflow through the plurality of server chassis of FIG. 12.

FIG. 14 is a graphical representation of partial airflow through the plurality of server chassis of FIG. 12 and FIG. 13. In FIG. 14, the majority of servers 100_a_ . . . 100_f_—the sections above side spacers 128_a_ and barriers 124_a_—are not shown to improve clarity. FIG. 14 illustrates a beneficial reduction in impedance similar to that of FIG. 13, but with regard to drawing airflow into passageways 126_a_. A server group 1400 includes servers 100_a_ . . . 100_e_ configured for forward airflow and a server group 1402 includes servers (only one representative server 100_f_ is shown) configured for reverse airflow. A collected airflow 1406 and 1404 are from server group 1400 and 1402. A collected airflow 1404 is behind server group 1402 and includes contribution from server group 1402 and 1400 because server group 1402 is configured for reverse flow with open barrier 124_a_ at that location between servers 1402 and the cold aisle.

FIG. 14 illustrates that airflow from the cold aisle may pass through any of passages 126_a_ from servers of server group 1400 and server group 1402 into the rear cap section of servers of group 1402. This distribution may reduce the impedance in the flow path of the servers of group 1402 without impacting the flow of servers of group 1400. The distribution may occur as follows. Airflow entering passages 126_a_ of servers of server group 1402 and 1400, and entering passageways 126_b_ in rear cap section 122_h_ of server group 1402 may added to by sideways airflow from any passageway 126_a_ of server group 1400. As shown in FIG. 14, this means that airflow entering passageway 126_b_ of server 100_f_ may have arrived via any of six different passageways 126_a_. This reduces the impedance of airflow entering passageways 126_b_ of servers of server group 1402. Similar to FIG. 13, the heated airflow of server group 1400 does not mingle with cold air being drawn into server group 1402 because barriers 124_a_ of server group 1400 are closed.

Figure 15:
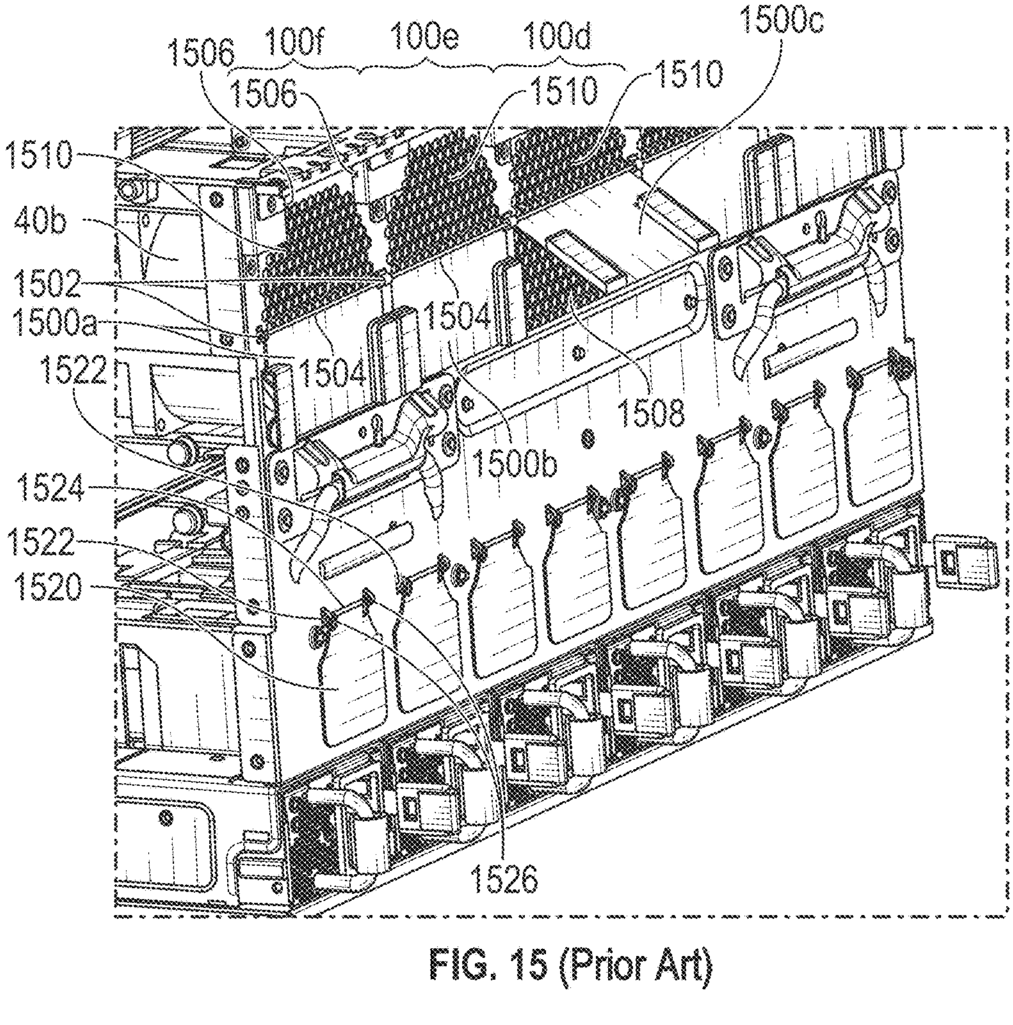
FIG. 15 (Prior Art)
FIG. 15 is an upper right rear perspective view of aspect of a prior art server chassis.
Figure 16:
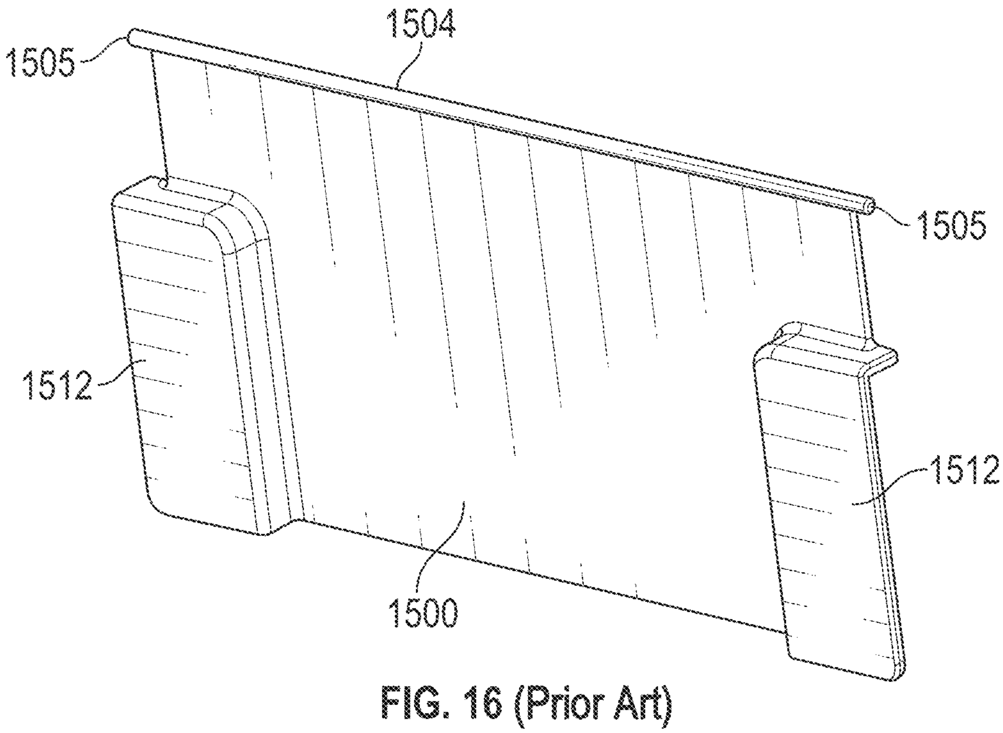
FIG. 16 (Prior Art)
FIG. 16 is an upper left rear perspective view of a prior art element of a server chassis.

FIG. 15 is an upper right rear perspective view of aspects of a prior art server chassis. FIG. 15 illustrates two prior art movable barriers, one or more of which may be used for any of barriers 124_a_ . . . 124_d_. In FIG. 15, a movable barrier includes a flap section 1500_a_ including an upper axle 1504 having posts 1505 (FIG. 16) that are received within bores 1502. Flap 1500_a_ is in the closed position covering the lower half of a perforated exhaust panel 1510. Flap 1500_a_ is closed by gravity and, when used in an embodiment, would prevent airflow into the chassis. Flap 1500_c_ is opened by the force of air flowing out of the chassis. Thus, when used in an embodiment, forward airflow from fan 40_b_ would cause flap 1500_a_ to pivot open about axle 1504 (as shown with flap 1500_c_) to reveal the lower half of exhaust panel 1510 (i.e., exhaust panel 1508). Reverse airflow from fan 40 would cause flap 1500_c_ to be drawn against perforated exhaust panel 1508 to the closed positions shown by flaps 1500_a_, 1500_b_. When used in embodiments, the upper halves of exhaust panels 1510 would also be provided with flaps with axles configured to be received within bores 1506. As a result, forward airflow from fan 40 would cause both the upper and lower flaps to open and reverse flow would draw both the upper and lower flaps to close. In embodiments, one or more flaps 1500_a_ may be combined to create a movable barrier, e.g., barrier 124_a_, 124_b_, 124_c_, or 124_d_. For example, a single flap 1500_a_ may be suitable for barriers 124_a_, 124_b_ in passageways 126_a_, 126_c_, while two or more flaps 1500_a_ may be combined to create barriers 124_c_, 124_d_ in frames 122_a_, 122_c_. In an embodiment, barriers 124_a_ . . . 124_c_ may be biased to the closed position, e.g., by a spring. FIG. 16 further illustrates flap 1500_a_ as an individual unit, flap 1500 having posts 1505 that are received by bores 1502 (FIG. 15). Recesses 1512 illustrates that flap 1500 may be adapted to conform to its environment, e.g., recesses 1512 are configured to allow flap 1500 to receive protrusions on either side of perforations 1508 and still close against perforations 1508.

Figure 17:
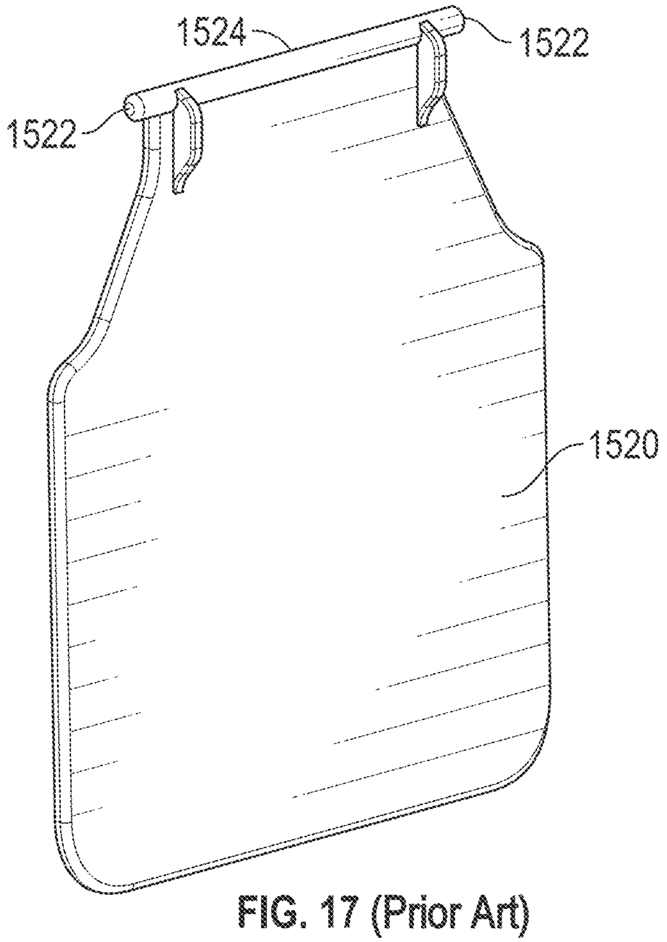
FIG. 17 (Prior Art)
FIG. 17 is an upper right rear perspective view of a prior art element of a server chassis.

In FIG. 15, a flap 1520 illustrates a second prior art movable barrier. Flap 1520 includes an axle 1524 with posts 1522 that are pivotably received within bores 1526. Flap 1520 represents a different configuration of a movable flap and otherwise operates as described with regard to flap 1500_a_. Similarly, one or more flaps 1520 may be used as any of barriers 124_a_ . . . 124_d_. FIG. 17 provides an enlarged view of flap 1520.

Embodiments thus allow the airflow through devices in a server to be reversed so that originally downstream devices, which receive airflow that has been heated by upstream devices, may, with a reversed airflow, become upstream devices receiving a cooler airflow. To provide a reverse flow, front, rear, upper, and lower channels are added to the server chassis and movable barriers are added to re-route the flow. In the normal forward flow, the upper and lower added channels are closed by two of the movable barriers. In the reverse flow, the upper and lower added channels are open (the two movable barriers are removed or dislodged) and the front and rear channels are created by closing barriers in front and rear cap sections.

TABLE 1

| | Measured air flow | Ta | Measured HDD power | upstream | | | | | | | downstream |
|---|---|---|---|---|---|---|---|---|---|---|---|
| 1 | 51.96 | 40 | 9.1 | 43 | 47 | 48 | 49 | 49 | 50 | 49 | 50 |
| 2 | 51.96 | 40 | 9.1 | 44 | 46 | 48 | 50 | 51 | 52 | 51 | 51 |
| 3 | 51.96 | 40 | 9.1 | 44 | 46 | 48 | 48 | 50 | 50 | 50 | 50 |

Table 1 illustrates that upstream drives receive cooler airflow than downstream drives. For example, in test 1, with a cold aisle air temperature of 40° C., the most upstream drive received airflow at 43° C. and the most downstream drive received airflow at 50° C.

In an embodiment, the height of passageways **126*a*, 126*d* may range from 0.25U to 1U. With passageway heights of 0.25U, airflow was found to drop to 57% of original (normally 46** CFM), which was determined to be insufficient for proper cooling. With heights of 0.5U, airflow was found to be 84% of original and sufficient for cooling. It is therefore suggested that passageway heights be maintained at 0.5U or at a height determined by testing to provide sufficient airflow.

Embodiments provide one or more of the following features: a server chassis that provides paths to provide cold aisle airflow directly to both ends of the chassis; an improvement in AFR and MTBF by reducing the average time components operate at high temperatures; a cooling capability that is improved over a chassis with a single airflow orientation; a back-to-back fan orientation that improves airflow in the reverse orientation; a use of fans that can reverse their rotations such that both fans can provide forward or reverse airflow; a reduction in cost by reducing fan speed and fan quantity (reducing fan speed equates to lower power usage and the use of less costly fans); and a reduction in noise by reducing fan speed and fan quantity.

Figure 18:
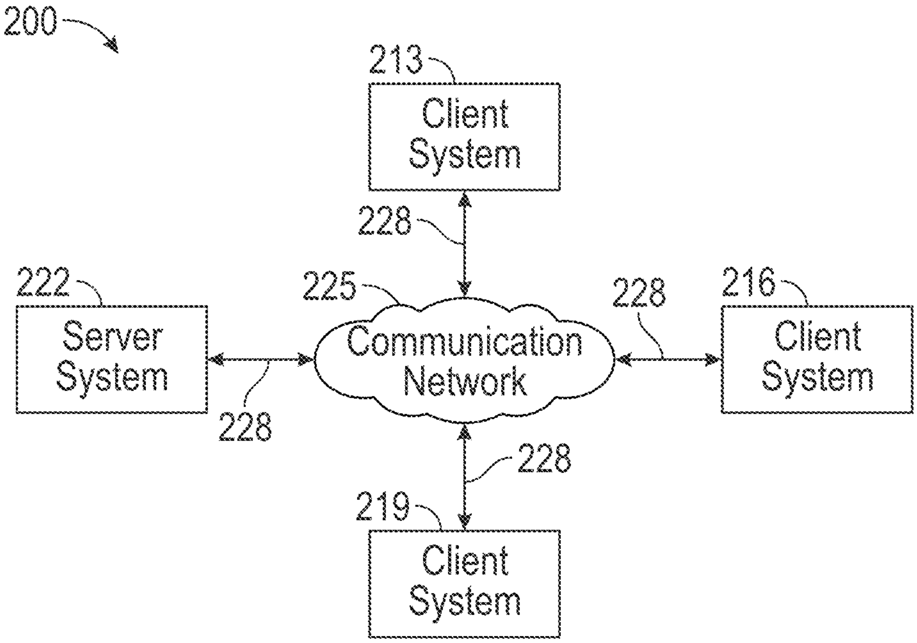
FIG. 18 is an exemplary block diagram depicting an embodiment of system for implement embodiments of methods of the disclosure.

FIG. 18 is an exemplary block diagram depicting an embodiment of a system for implementing embodiments of methods of the disclosure, e.g., as described with reference to the previous figures, and particularly controller 134. In FIG. 18, distributed computer network system 200 includes a number of computing devices, e.g., client systems 213, 216, 219, and one or more server systems 222 coupled to a communication network 225 via a plurality of communication links 228. Communication network 225 provides a mechanism for allowing the various components of distributed network 200 to communicate and exchange information with each other. Thus, FIG. 18 describes systems, e.g., client systems 213, 216, 219, for implementing elements of the above disclosure, e.g., control module 134.

Communication network 225 itself is comprised of one or more interconnected computer systems and communication links. Communication links 228 may include hardwire links, optical links, satellite or other wireless communications links, wave propagation links, or any other mechanisms for communication of information. Various communication protocols may be used to facilitate communication between the various systems shown in FIG. 18. These communication protocols may include TCP/IP, UDP, HTTP protocols, wireless application protocol (WAP), BLUETOOTH, Zigbee, 802.11, 802.15, 6LoWPAN, LiFi, Google Weave, NFC, GSM, CDMA, other cellular data communication protocols, wireless telephony protocols, Internet telephony, IP telephony, digital voice, voice over broadband (VoBB), broadband telephony, Voice over IP (VOIP), vendor-specific protocols, customized protocols, and others. While in one embodiment, communication network 225 is the Internet, in other embodiments, communication network 225 may be any suitable communication network including a local area network (LAN), a wide area network (WAN), a wireless network, a cellular network, a personal area network, an intranet, a private network, a near field communications (NFC) network, a public network, a switched network, a peer-to-peer network, and combinations of these, and the like.

In an embodiment, the server 222 is not located near a user of a computing device, and is communicated with over a network. In a different embodiment, the server 222 is a device that a user can carry upon his person, or can keep nearby. In an embodiment, the server 222 has a large battery to power long distance communications networks such as a cell network (LTE, 5G), or Wi-Fi. The server 222 communicates with the other components of the system via wired links or via low powered short-range wireless communications such as Bluetooth®. In an embodiment, one of the other components of the system plays the role of the server, e.g., the client system 213.

Distributed computer network 200 in FIG. 18 is merely illustrative of an embodiment incorporating the embodiments and does not limit the scope of the invention as recited in the claims. One of ordinary skill in the art would recognize other variations, modifications, and alternatives. For example, more than one server system 222 may be connected to communication network 225. As another example, a number of computing devices 213, 216, 219 may be coupled to communication network 225 via an access provider (not shown) or via some other server system.

Computing devices 213, 216, 219 typically request information from a server system that provides the information. Server systems by definition typically have more computing and storage capacity than these computing devices, which are often such things as portable devices, mobile communications devices, or other computing devices that play the role of a client in a client-server operation. However, a particular computing device may act as both a client and a server depending on whether the computing device is requesting or providing information. Aspects of the embodiments may be embodied using a client-server environment or a cloud-cloud computing environment.

Server 222 is responsible for receiving information requests from computing devices 213, 216, 219, for performing processing required to satisfy the requests, and for forwarding the results corresponding to the requests back to the requesting computing device. The processing required to satisfy the request may be performed by server system 222 or may alternatively be delegated to other servers connected to communication network 225 or to other communications networks. A server 222 may be located near the computing devices 213, 216, 219 or may be remote from the computing devices 213, 216, 219. A server 222 may be a hub controlling a local enclave of things in an internet of things scenario.

Computing devices 213, 216, 219 may enable users to access and query information or applications stored by server system 222. Some example computing devices include portable electronic devices (e.g., mobile communications devices) such as the Apple iPhone®, the Apple iPad®, the Palm Pre™, or any computing device running the Apple iOS™, Android™ OS, Google Chrome OS, Symbian OS®, Windows 10, Windows Mobile® OS, Palm OS® or Palm Web OS™, or any of various operating systems used for Internet of Things (IoT) devices or automotive or other vehicles or Real Time Operating Systems (RTOS), such as the RIOT OS, Windows 10 for IoT, WindRiver VxWorks, Google Brillo, ARM Mbed OS, Embedded Apple iOS and OS X, the Nucleus RTOS, Green Hills Integrity, or Contiki, or any of various Programmable Logic Controller (PLC) or Programmable Automation Controller (PAC) operating systems such as Microware OS-9, VxWorks, QNX Neutrino, FreeRTOS, Micrium μC/OS-II, Micrium μC/OS-III, Windows CE, TI-RTOS, RTEMS. Other operating systems may be used. In a specific embodiment, a "web browser" application executing on a computing device enables users to select, access, retrieve, or query information and/or applications stored by server system 222. Examples of web browsers include the Android browser provided by Google, the Safari® browser provided by Apple, the Opera Web browser provided by Opera Software, the BlackBerry® browser provided by Research In Motion, the Internet Explorer® and Internet Explorer Mobile browsers provided by Microsoft Corporation, the Firefox® and Firefox for Mobile browsers provided by Mozilla®, and others.

Figure 19:
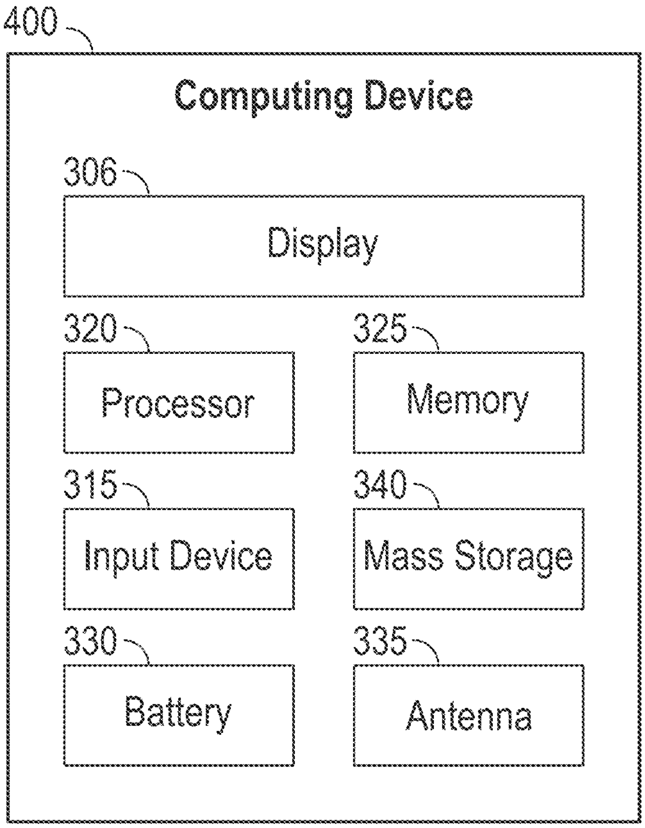
FIG. 19 is an exemplary block diagram depicting a computing device of an embodiment.

FIG. 19 is an exemplary block diagram depicting a computing device 300 of an embodiment. Computing device 300 may be any of the computing devices 213, 216, 219 from FIG. 18. Computing device 300 may include a display, screen, or monitor 306, housing 308, and input device 315. Housing 308 houses familiar computer components, some of which are not shown, such as a processor 320, memory 325, battery 330, speaker, transceiver, antenna 335, microphone, ports, jacks, connectors, camera, input/output (I/O) controller, display adapter, network interface, mass storage devices 340, various sensors, and the like.

Input device 315 may also include a touchscreen (e.g., resistive, surface acoustic wave, capacitive sensing, infrared, optical imaging, dispersive signal, or acoustic pulse recognition), keyboard (e.g., electronic keyboard or physical keyboard), buttons, switches, stylus, or combinations of these.

Mass storage devices 340 may include flash and other nonvolatile solid-state storage or solid-state drive (SSD), such as a flash drive, flash memory, or USB flash drive. Other examples of mass storage include mass disk drives, floppy disks, magnetic disks, optical disks, magneto-optical disks, fixed disks, hard disks, SD cards, CD-ROMs, recordable CDs, DVDs, recordable DVDs (e.g., DVD-R, DVD+R, DVD-RW, DVD+RW, HD-DVD, or Blu-ray Disc), battery-backed-up volatile memory, tape storage, reader, and other similar media, and combinations of these.

Embodiments may also be used with computer systems having different configurations, e.g., with additional or fewer subsystems, and may include systems provided by Arduino, or Raspberry Pi. For example, a computer system could include more than one processor (i.e., a multiprocessor system, which may permit parallel processing of information) or a system may include a cache memory. The computer system shown in FIG. 19 is but an example of a computer system suitable for use with the embodiments. Other configurations of subsystems suitable for use with the embodiments will be readily apparent to one of ordinary skill in the art. For example, in a specific implementation, the computing device is a mobile communications device such as a smartphone or tablet computer. Some specific examples of smartphones include the Droid Incredible and Google *Nexus* One, provided by HTC Corporation, the iPhone or iPad, both provided by Apple, and many others. The computing device may be a laptop or a netbook. In another specific implementation, the computing device is a non-portable computing device such as a desktop computer or workstation.

A computer-implemented or computer-executable version of the program instructions useful to practice the embodiments may be embodied using, stored on, or associated with computer-readable medium. A computer-readable medium may include any medium that participates in providing instructions to one or more processors for execution, such as memory 325 or mass storage 340. Such a medium may take many forms including, but not limited to, nonvolatile, volatile, transmission, non-printed, and printed media. Nonvolatile media includes, for example, flash memory, or optical or magnetic disks. Volatile media includes static or dynamic memory, such as cache memory or RAM. Transmission media includes coaxial cables, copper wire, fiber optic lines, and wires arranged in a bus. Transmission media can also take the form of electromagnetic, radio frequency, acoustic, or light waves, such as those generated during radio wave and infrared data communications.

For example, a binary, machine-executable version of the software useful to practice the embodiments may be stored or reside in RAM or cache memory, or on mass storage device 340. The source code of this software may also be stored or reside on mass storage device 340 (e.g., flash drive, hard disk, magnetic disk, tape, or CD-ROM). As a further example, code useful for practicing the embodiments may be transmitted via wires, radio waves, or through a network such as the Internet. In another specific embodiment, a computer program product including a variety of software program code to implement features of the embodiment is provided.

Computer software products may be written in any of various suitable programming languages, such as C, C++, C#, Pascal, Fortran, Perl, Matlab (from Math Works, www.mathworks.com), SAS, SPSS, JavaScript, CoffeeScript, Objective-C, Swift, Objective-J, Ruby, Rust, Python, Erlang, Lisp, Scala, Clojure, and Java. The computer software product may be an independent application with data input and data display modules. Alternatively, the computer software products may be classes that may be instantiated as distributed objects. The computer software products may also be component software such as Java Beans (from Oracle) or Enterprise Java Beans (EJB from Oracle).

An operating system for the system may be the Android operating system, iPhone OS (i.e., iOS), Symbian, BlackBerry OS, Palm web OS, Bada, MeeGo, Maemo, Limo, or Brew OS. Other examples of operating systems include one of the Microsoft Windows family of operating systems (e.g., Windows 95, 98, Me, Windows NT, Windows 2000, Windows XP, Windows XP x64 Edition, Windows Vista, Windows 10 or other Windows versions, Windows CE, Windows Mobile, Windows Phone, Windows 10 Mobile), Linux, HP-UX, UNIX, Sun OS, Solaris, Mac OS X, Alpha OS, AIX, IRIX32, or IRIX64, or any of various operating systems used for Internet of Things (IoT) devices or automotive or other vehicles or Real Time Operating Systems (RTOS), such as the RIOT OS, Windows 10 for IOT, WindRiver VxWorks, Google Brillo, ARM Mbed OS, Embedded Apple iOS and OS X, the Nucleus RTOS, Green Hills Integrity, or Contiki, or any of various Programmable Logic Controller (PLC) or Programmable Automation Controller (PAC) operating systems such as Microware OS-9, VxWorks, QNX Neutrino, FreeRTOS, Micrium μC/OS-II, Micrium μC/OS-III, Windows CE, TI-RTOS, RTEMS. Other operating systems may be used.

Furthermore, the computer may be connected to a network and may interface to other computers using this network. The network may be an intranet, internet, or the Internet, among others. The network may be a wired network (e.g., using copper, and connections such as RS232 connectors), telephone network, packet network, an optical network (e.g., using optical fiber), or a wireless network, or any combination of these. For example, data and other information may be passed between the computer and components (or steps) of a system useful in practicing the embodiments using a wireless network employing a protocol such as Wi-Fi (IEEE standards 802.11, 802.11a, 802.11b, 802.11e, 802.11g, 802.11i, and 802.11n, just to name a few examples), or other protocols, such as BLUETOOTH or NFC or 802.15 or cellular, or communication protocols may include TCP/IP, UDP, HTTP protocols, wireless application protocol (WAP), BLUETOOTH, Zigbee, 802.11, 802.15, 6LoWPAN, LiFi, Google Weave, NFC, GSM, CDMA, other cellular data communication protocols, wireless telephony protocols or the like. For example, signals from a computer may be transferred, at least in part, wirelessly to components or other computers.

Consistent with the foregoing, in at least one case referred to herein as Example A-1, an apparatus comprises: a first horizontal surface having a first end and a second end; a second horizontal surface having a first end, a middle section and a second end, the second horizontal surface being positioned below the first horizontal surface to create a first airflow channel between the first and second horizontal surfaces; a third horizontal surface having a first end, a second end and a middle section, the middle section being configured to support: a circuit board having a plurality of electronic devices connected thereto, at least one fan located near the first end of the third horizontal surface, and a controller for controlling a direction of airflow generated by the at least one fan, the third horizontal surface being positioned below the second horizontal surface to create a second airflow channel between the second and third horizontal surfaces; a fourth horizontal surface having a first end and a second end, the fourth horizontal surface being positioned below the third horizontal surface to create a third airflow channel between the third and fourth horizontal surfaces; a first movable barrier provided in a front-end frame connecting the second end of the second horizontal surface and the second end of the fourth horizontal surface; a second movable barrier provided in a rear-end frame connecting the second end of the first horizontal surface and the second end of the third horizontal surface; a third movable barrier connected to one of the first horizontal surface or the second horizontal surface, the third movable barrier extending vertically between the first horizontal surface and the second horizontal surface perpendicular to the first airflow channel when closed; and a fourth movable barrier connected to one of the third horizontal surface or the fourth horizontal surface, the fourth movable barrier extending vertically between the third horizontal surface and the fourth horizontal surface perpendicular to the third airflow channel when closed.

In another case referred to herein as Example A-2, the apparatus of Example A-1, or any other exemplary embodiment described herein, may be further limited wherein the middle section is further configured to position the at least one fan such that rotation of the at least one fan in a first direction causes airflow in a forward direction and rotation in a second direction, which is in reverse of the first direction, causes airflow in a reverse direction.

In another case referred to herein as Example A-3, the apparatus of Example A-1, or any other exemplary embodiment described herein, may be further limited wherein the middle section is further configured to support a first fan positioned to cause a first forward airflow and a first reverse airflow and a second fan positioned to cause a second forward airflow and a second reverse airflow, wherein a first airflow is caused by the first forward airflow of the first fan and a second airflow is caused by the second forward airflow of the second fan.

In another case referred to herein as Example A-4, the apparatus of Example A-3, or any other exemplary embodiment described herein, may be further limited wherein the first airflow is caused by the first forward airflow of the first fan and the second reverse airflow of the second fan and the second airflow is caused by the first reverse airflow of the first fan and the second forward airflow of the second fan.

In another case referred to herein as Example A-5, the apparatus of Example A-1, or any other exemplary embodiment described herein, may be further limited wherein the first movable barrier includes a first one-way valve, the second barrier includes a second one-way valve, the third barrier includes a third one-way valve, and the fourth barrier includes a fourth one-way valve, wherein the first airflow causes the first one-way valve and the second one-way valve to open and the second airflow causes the third one-way valve and the fourth one-way valve to open, and wherein the first airflow causes the third one-way valve and the fourth one-way valve to maintain closed positions and the second airflow causes the first one-way valve and the second one-way valve to maintain closed positions.

In another case referred to herein as Example A-6, the apparatus of Example A-5, or any other exemplary embodiment described herein, may be further limited wherein the first one-way valve includes a first flap pivotally connected to the front-end frame, the second one-way valve includes a second flap pivotally connected to the rear-end frame, the third one-way valve includes a third flap pivotally connected to the first horizontal surface, and the fourth one-way valve includes a fourth flap pivotally connected to the third horizontal surface.

In another case referred to herein as Example A-7, the apparatus of Example A-5, or any other exemplary embodiment described herein, may be further limited wherein the first airflow channel includes a first duct leading from the first end of the second horizontal surface toward the second end of the second horizontal surface and the third airflow channel includes a second duct leading away from the second end of the third horizontal surface toward the first end of the third horizontal surface.

In another case referred to herein as Example A-8, the apparatus of Example A-7, or any other exemplary embodiment described herein, may further be limited wherein the middle section is further configured to support: i) a first electronic device connected to the circuit board, the first electronic device being configured to provide first temperature data to the controller, and ii) a second electronic device connected to the circuit board, the second electronic device being configured to provide second temperature data to the controller.

Consistent with the foregoing, in at least one case referred to herein as Example B-1, a method comprising: providing a chassis having a front end and a rear end, the chassis including: a first horizontal surface having a first end and a second end, a second horizontal surface having a first end, a middle section and a second end, the second horizontal surface being positioned below the first horizontal surface to create a first airflow channel between the first and second horizontal surfaces, a third horizontal surface having a first end, a second end, and a middle section, a fourth horizontal surface having a first end and a second end, the fourth horizontal surface being positioned below the third horizontal surface to create a second airflow channel between the third and fourth horizontal surfaces, a first movable barrier provided in a front-end frame connecting the second end of the second horizontal surface and the second end of the fourth horizontal surface, a second movable barrier provided in a rear-end frame connecting the second end of the first horizontal surface and the second end of the third horizontal surface, a third movable barrier connected to one of the first horizontal surface or the second horizontal surface, the third movable barrier extending vertically between the first horizontal surface and the second horizontal surface perpendicular to the first airflow channel when closed, a fourth movable barrier connected to one of the third horizontal surface or the fourth horizontal surface, the fourth movable barrier extending vertically between the third horizontal surface and the fourth horizontal surface perpendicular to the second airflow channel when closed; a circuit board having a plurality of electronically connected electronic devices, the circuit board being connected to the middle section of the third horizontal surface; and at least one fan connected to the third horizontal surface near the third horizontal surface first end; causing, by a controller, airflow to be generated in: i) a forward direction that causes the first and second movable barriers to move into open positions and the third and fourth movable barriers to remain in closed positions and air to flow through a third air channel through the electronic devices, or ii) a reverse direction that causes the first and second movable barriers to remain in closed positions and the third and fourth movable barriers to move into open positions and air to flow through the second, third and first airflow channels, respectively.

In another case referred to herein as Example B-2, the method of Example B-1, or any other exemplary embodiment described herein, may further comprise: receiving, by the controller, first temperature data regarding a first electronic device of the plurality of electronic devices and a second temperature data regarding a second electronic device of the plurality of electronic devices; determining, by the controller, based upon the first temperature data and the second temperature data, whether the first electronic device is to receive airflow before the second electronic device; and causing, by the controller, the at least one fan to generate airflow in the forward direction in response to a determination that the first electronic device is to receive airflow before the second electronic device.

In another case referred to herein as Example B-3, the method of Example B-1, or any other exemplary embodiment described herein, may further comprise: receiving, by the controller, first temperature data regarding a first electronic device of the plurality of electronic devices and a second temperature data regarding a second electronic device of the plurality of electronic devices; determining, by the controller, based upon the first temperature data and the second temperature data, whether the first electronic device is to receive airflow before the second electronic device; and causing, by the controller, the at least one fan to generate airflow in the reverse direction in response to a determination that the first electronic device is to receive airflow after the second electronic device.

In another case referred to herein as Example B-4, the method of Example B-2, or any other exemplary embodiment described herein, may be further limited wherein determining whether the first electronic device is to receive airflow before the second electronic device includes determining, by the controller, that the first electronic device is nearer a first threshold temperature than the second electronic device.

In another case referred to herein as Example B-5, the method of Example B-3, or any other exemplary embodiment described herein, may be further limited wherein determining whether the first electronic device is to receive airflow before the second electronic device includes determining, by the controller, that the second electronic device is nearer the first threshold temperature than the first electronic device.

In another case referred to herein as Example B-6, the method of Example B-1, or any other exemplary embodiment described herein, may be further limited wherein causing the first movable barrier and the second movable barrier to open when the airflow is in the forward direction includes causing, by the first airflow, a first one-way valve of the first movable barrier and a second one-way valve of the second movable barrier to move to open positions while maintaining a third one-way valve of the third movable barrier and a fourth one-way valve of the fourth movable barrier in closed positions.

In another case referred to herein as Example B-7, the method of Example B-1, or any other exemplary embodiment described herein, may be further limited wherein causing the third movable barrier and the fourth movable barrier to open when the airflow is in the reverse direction includes causing, by the first airflow, a first one-way valve of the third movable barrier and a second one-way valve of the fourth movable to move to open positions while maintaining a third one-way valve of the first movable barrier and a fourth one-way valve of the second movable barrier in closed positions.

Consistent with the foregoing, in at least one case referred to herein as Example C-1, a system comprising: a chassis including: a first horizontal surface having a first end and a second end, a second horizontal surface having a first end, a middle section and a second end, the second horizontal surface being positioned below the first horizontal surface to create a first airflow channel between the first and second horizontal surfaces, a third horizontal surface having a first end, a second end and a middle section, a fourth horizontal surface having a first end and a second end, the fourth horizontal surface being positioned below the third horizontal surface to create a second airflow channel between the third and fourth horizontal surfaces, a first movable barrier provided in a front-end frame connecting the second end of the second horizontal surface and the second end of the fourth horizontal surface, a second movable barrier provided in a rear-end frame connecting the second end of the first horizontal surface and the second end of the third horizontal surface, a third movable barrier connected to one of the first horizontal surface or the second horizontal surface, the third movable barrier extending vertically between the first horizontal surface and the second horizontal surface perpendicular to the first airflow channel, and a fourth movable barrier connected to one of the third horizontal surface or the fourth horizontal surface, the fourth movable barrier extending vertically between the third horizontal surface and the fourth horizontal surface perpendicular to the second airflow channel; and a circuit board having a plurality of electronically connected electronic devices, the circuit board being connected to the middle section of the third horizontal surface; at least one fan connected to the third horizontal surface near the third horizontal surface first end; and a controller connected to the third horizontal surface for controlling a direction of airflow generated by the at least one fan.

In another case referred to herein as Example C-2, the method of Example C-1, or any other exemplary embodiment described herein, may be further limited wherein the at least one fan is positioned such that rotation in a first direction causes airflow in a forward direction and rotation in a second direction, which is in reverse of the first direction, causes airflow in a reverse direction.

In another case referred to herein as Example C-3, the method of Example C-1, or any other exemplary embodiment described herein, may be further limited wherein the at least one fan comprises a first fan positioned to cause a first forward airflow and a first reverse airflow and a second fan positioned to cause a second forward airflow and a second reverse airflow, wherein a first airflow is caused by the first forward airflow of the first fan and a second airflow is caused by the second forward airflow of the second fan.

In another case referred to herein as Example C-4, the method of Example C-3, or any other exemplary embodiment described herein, may be further limited wherein the first airflow is caused by the first forward airflow of the first fan and the second reverse airflow of the second fan and the second airflow is caused by the first reverse airflow of the first fan and the second forward airflow of the send fan.

In another case referred to herein as Example C-5, the method of Example C-1, or any other exemplary embodiment described herein, may be further limited wherein the first movable barrier includes a first one-way valve, the second barrier includes a second one-way valve, the third barrier includes a third one-way valve, and the fourth barrier includes a fourth one-way valve, wherein the first airflow causes the first one-way valve and the second one-way valve to open and the second airflow causes the third one-way valve and the fourth one-way valve to open, and wherein the first airflow causes the third one-way valve and the fourth one-way valve to maintain closed positions and the second airflow causes the first one-way valve and the second one-way valve to maintain closed positions.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:

a first horizontal surface having a first end and a second end;

a second horizontal surface having a first end, a middle section and a second end, the second horizontal surface being positioned below the first horizontal surface to create a first airflow channel between the first and second horizontal surfaces;

a third horizontal surface having a first end, a second end and a middle section, the middle section being configured to support: a circuit board having a plurality of electronic devices connected thereto, at least one fan located near the first end of the third horizontal surface, and a controller for controlling a direction of airflow generated by the at least one fan, the third horizontal surface being positioned below the second horizontal surface to create a second airflow channel between the second and third horizontal surfaces;

a fourth horizontal surface having a first end and a second end, the fourth horizontal surface being positioned below the third horizontal surface to create a third airflow channel between the third and fourth horizontal surfaces;

a first movable barrier provided in a front-end frame connecting the second end of the second horizontal surface and the second end of the fourth horizontal surface;

a second movable barrier provided in a rear-end frame connecting the second end of the first horizontal surface and the second end of the third horizontal surface;

a third movable barrier connected to one of the first horizontal surface or the second horizontal surface, the third movable barrier extending vertically between the first horizontal surface and the second horizontal surface perpendicular to the first airflow channel when closed; and a fourth movable barrier connected to one of the third horizontal surface or the fourth horizontal surface, the fourth movable barrier extending vertically between the third horizontal surface and the fourth horizontal surface perpendicular to the third airflow channel when closed.

2. The apparatus of claim 1, wherein the middle section is further configured to position the at least one fan such that rotation of the at least one fan in a first direction causes airflow in a forward direction and rotation in a second direction, which is in reverse of the first direction, causes airflow in a reverse direction.

3. The apparatus of claim 1, wherein the middle section is further configured to support a first fan positioned to cause a first forward airflow and a first reverse airflow and a second fan positioned to cause a second forward airflow and a second reverse airflow, wherein a first airflow is caused by the first forward airflow of the first fan and a second airflow is caused by the second forward airflow of the second fan.

4. The apparatus of claim 3, wherein the first airflow is caused by the first forward airflow of the first fan and the second reverse airflow of the second fan and the second airflow is caused by the first reverse airflow of the first fan and the second forward airflow of the second fan.

5. The apparatus of claim 1, wherein the first movable barrier includes a first one-way valve, the second barrier includes a second one-way valve, the third barrier includes a third one-way valve, and the fourth barrier includes a fourth one-way valve, wherein the first airflow causes the first one-way valve and the second one-way valve to open and the second airflow causes the third one-way valve and the fourth one-way valve to open, and wherein the first airflow causes the third one-way valve and the fourth one-way valve to maintain closed positions and the second airflow causes the first one-way valve and the second one-way valve to maintain closed positions.

6. The apparatus of claim 5, wherein the first one-way valve includes a first flap pivotally connected to the front-end frame, the second one-way valve includes a second flap pivotally connected to the rear-end frame, the third one-way valve includes a third flap pivotally connected to the first horizontal surface, and the fourth one-way valve includes a fourth flap pivotally connected to the third horizontal surface.

7. The apparatus of claim 5, wherein the first airflow channel includes a first duct leading from the first end of the second horizontal surface toward the second end of the second horizontal surface and the third airflow channel includes a second duct leading away from the second end of the third horizontal surface toward the first end of the third horizontal surface.

8. The apparatus of claim 7, wherein the middle section is further configured to support: i) a first electronic device connected to the circuit board, the first electronic device being configured to provide first temperature data to the controller, and ii) a second electronic device connected to the circuit board, the second electronic device being configured to provide second temperature data to the controller.

9. A method comprising:

providing a chassis having a front end and a rear end, the chassis including:
- a first horizontal surface having a first end and a second end,
- a second horizontal surface having a first end, a middle section and a second end, the second horizontal surface being positioned below the first horizontal surface to create a first airflow channel between the first and second horizontal surfaces,
- a third horizontal surface having a first end, a second end, and a middle section,
- a fourth horizontal surface having a first end and a second end, the fourth horizontal surface being positioned below the third horizontal surface to create a second airflow channel between the third and fourth horizontal surfaces,
- a first movable barrier provided in a front-end frame connecting the second end of the second horizontal surface and the second end of the fourth horizontal surface,
- a second movable barrier provided in a rear-end frame connecting the second end of the first horizontal surface and the second end of the third horizontal surface,
- a third movable barrier connected to one of the first horizontal surface or the second horizontal surface, the third movable barrier extending vertically between the first horizontal surface and the second horizontal surface perpendicular to the first airflow channel when closed,
- a fourth movable barrier connected to one of the third horizontal surface or the fourth horizontal surface, the fourth movable barrier extending vertically between the third horizontal surface and the fourth horizontal surface perpendicular to the second airflow channel when closed;
- a circuit board having a plurality of electronically connected electronic devices, the circuit board being connected to the middle section of the third horizontal surface; and
- at least one fan connected to the third horizontal surface near the third horizontal surface first end;

causing, by a controller, airflow to be generated in: i) a forward direction that causes the first and second movable barriers to move into open positions and the third and fourth movable barriers to remain in closed positions and air to flow through a third air channel through the electronic devices, or ii) a reverse direction that causes the first and second movable barriers to remain in closed positions and the third and fourth movable barriers to move into open positions and air to flow through the second, third and first airflow channels, respectively.

10. The method of claim 9, further comprising:

receiving, by the controller, first temperature data regarding a first electronic device of the plurality of electronic devices and a second temperature data regarding a second electronic device of the plurality of electronic devices;

determining, by the controller, based upon the first temperature data and the second temperature data, whether the first electronic device is to receive airflow before the second electronic device; and causing, by the controller, the at least one fan to generate airflow in the forward direction in response to a determination that the first electronic device is to receive airflow before the second electronic device.

11. The method of claim 10, wherein determining whether the first electronic device is to receive airflow before the second electronic device includes determining, by the controller, that the first electronic device is nearer a first threshold temperature than the second electronic device.

12. The method of claim 9, further comprising:

receiving, by the controller, first temperature data regarding a first electronic device of the plurality of electronic devices and a second temperature data regarding a second electronic device of the plurality of electronic devices;

determining, by the controller, based upon the first temperature data and the second temperature data, whether the first electronic device is to receive airflow before the second electronic device; and causing, by the controller, the at least one fan to generate airflow in the reverse direction in response to a determination that the first electronic device is to receive airflow after the second electronic device.

13. The method of claim 12, wherein determining whether the first electronic device is to receive airflow before the second electronic device includes determining, by the controller, that the second electronic device is nearer the first threshold temperature than the first electronic device.

14. The method of claim 9, wherein causing the first movable barrier and the second movable barrier to open when the airflow is in the forward direction includes causing, by the first airflow, a first one-way valve of the first movable barrier and a second one-way valve of the second movable barrier to move to open positions while maintaining a third one-way valve of the third movable barrier and a fourth one-way valve of the fourth movable barrier in closed positions.

15. The method of claim 9, wherein causing the third movable barrier and the fourth movable barrier to open when the airflow is in the reverse direction includes causing, by the first airflow, a first one-way valve of the third movable barrier and a second one-way valve of the fourth movable to move to open positions while maintaining a third one-way valve of the first movable barrier and a fourth one-way valve of the second movable barrier in closed positions.

16. A system comprising:

a chassis including:

a first horizontal surface having a first end and a second end, a second horizontal surface having a first end, a middle section and a second end, the second horizontal surface being positioned below the first horizontal surface to create a first airflow channel between the first and second horizontal surfaces, a third horizontal surface having a first end, a second end and a middle section, a fourth horizontal surface having a first end and a second end, the fourth horizontal surface being positioned below the third horizontal surface to create a second airflow channel between the third and fourth horizontal surfaces, a first movable barrier provided in a front-end frame connecting the second end of the second horizontal surface and the second end of the fourth horizontal surface, a second movable barrier provided in a rear-end frame connecting the second end of the first horizontal surface and the second end of the third horizontal surface, a third movable barrier connected to one of the first horizontal surface or the second horizontal surface, the third movable barrier extending vertically between the first horizontal surface and the second horizontal surface perpendicular to the first airflow channel, and a fourth movable barrier connected to one of the third horizontal surface or the fourth horizontal surface, the fourth movable barrier extending vertically between the third horizontal surface and the fourth horizontal surface perpendicular to the second airflow channel; and a circuit board having a plurality of electronically connected electronic devices, the circuit board being connected to the middle section of the third horizontal surface;

at least one fan connected to the third horizontal surface near the third horizontal surface first end; and a controller connected to the third horizontal surface for controlling a direction of airflow generated by the at least one fan.

17. The system of claim 16, wherein the at least one fan is positioned such that rotation in a first direction causes airflow in a forward direction and rotation in a second direction, which is in reverse of the first direction, causes airflow in a reverse direction.

18. The system of claim 16, wherein the at least one fan comprises a first fan positioned to cause a first forward airflow and a first reverse airflow and a second fan positioned to cause a second forward airflow and a second reverse airflow, wherein a first airflow is caused by the first forward airflow of the first fan and a second airflow is caused by the second forward airflow of the second fan.

19. The system of claim 18, wherein the first airflow is caused by the first forward airflow of the first fan and the second reverse airflow of the second fan and the second airflow is caused by the first reverse airflow of the first fan and the second forward airflow of the send fan.

20. The system of claim 16, wherein the first movable barrier includes a first one-way valve, the second barrier includes a second one-way valve, the third barrier includes a third one-way valve, and the fourth barrier includes a fourth one-way valve, wherein the first airflow causes the first one-way valve and the second one-way valve to open and the second airflow causes the third one-way valve and the fourth one-way valve to open, and wherein the first airflow causes the third one-way valve and the fourth one-way valve to maintain closed positions and the second airflow causes the first one-way valve and the second one-way valve to maintain closed positions.

* * * * *